(12) United States Patent
Fujimoto et al.

(10) Patent No.: US 10,414,021 B2
(45) Date of Patent: Sep. 17, 2019

(54) POLISHING ABRASIVE PARTICLE, PRODUCTION METHOD THEREFORE, POLISHING METHOD, POLISHING DEVICE, AND SLURRY

(71) Applicant: ASAHI KASEI KOGYO CO., LTD., Tokyo (JP)

(72) Inventors: Shunichi Fujimoto, Saitama (JP); Tetsuji Yamashita, Kanagawa (JP)

(73) Assignee: ASAHI KASEI KOGYO CO., LTD., Tokyo (JP)

( * ) Notice: Subject to any disclaimer, the term of this patent is extended or adjusted under 35 U.S.C. 154(b) by 380 days.

(21) Appl. No.: 15/110,320

(22) PCT Filed: Jan. 19, 2015

(86) PCT No.: PCT/JP2015/051175
§ 371 (c)(1),
(2) Date: Jul. 7, 2016

(87) PCT Pub. No.: WO2015/118927
PCT Pub. Date: Aug. 13, 2015

(65) Prior Publication Data
US 2016/0325398 A1    Nov. 10, 2016

(30) Foreign Application Priority Data

Feb. 6, 2014 (JP) .................................. 2014-021392
Jul. 17, 2014 (JP) .................................. 2014-146604
Nov. 27, 2014 (JP) .................................. 2014-239600

(51) Int. Cl.
*C09G 1/02* (2006.01)
*C09K 3/14* (2006.01)
(Continued)

(52) U.S. Cl.
CPC .......... *B24B 37/245* (2013.01); *B24B 37/044* (2013.01); *C09G 1/02* (2013.01);
(Continued)

(58) Field of Classification Search
CPC ...... C09K 3/14; C09K 3/1454; C09K 3/1409; C09K 3/1427; C09K 3/1445; C09K 3/1472; C09G 1/02
See application file for complete search history.

(56) References Cited

U.S. PATENT DOCUMENTS

| 4,881,951 | A  | * | 11/1989 | Monroe | ............ C04B 35/1115 |
|---|---|---|---|---|---|
| | | | | | 51/309 |
| 2002/0095871 | A1 | * | 7/2002 | McArdle | .................. B24D 3/14 |
| | | | | | 51/298 |
| 2005/0137077 | A1 | * | 6/2005 | Bange | .................... B24D 18/00 |
| | | | | | 501/127 |

FOREIGN PATENT DOCUMENTS

JP    2006-315110    11/2006

* cited by examiner

*Primary Examiner* — Pegah Parvini
(74) *Attorney, Agent, or Firm* — Jeffrey S. Melcher; Melcher Patent Law PLLC

(57) ABSTRACT

The present invention is objected to polish the surface of the object material with a high quality at a high polishing rate. The object surface is polished using a wet polishing method. Slurry is produced by scattering abrasive particles into pure water. In the abrasive particle, where components which has a mechanochemical effect and which reacts to the friction heat generated in polishing the object material are joined with each other and integrated to a particle. There, respective component is joined with each other using a mechanical alloying process, while maintaining the inherent material properties. When the slurry is used in a lapping process of sapphire, silicon carbide, gallium nitride and the like, the polishing process can be substantially shortened and the (Continued)

processing cost is drastically reduced. Further, it secures a high quality of the polishing surface. The abrasive particle can be used repeatedly in the polishing process. Since the pH value of the slurry is around 3 to 9, it does not deteriorate working environment and the liquid-waste treatment is easy.

25 Claims, 12 Drawing Sheets

(51) Int. Cl.
 *B24B 37/24* (2012.01)
 *B24B 37/04* (2012.01)
 *H01L 21/02* (2006.01)
(52) U.S. Cl.
 CPC .......... *C09K 3/1463* (2013.01); *C09K 3/1472* (2013.01); *H01L 21/02024* (2013.01)

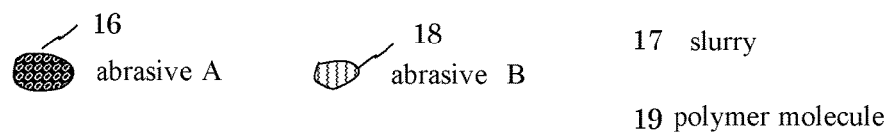
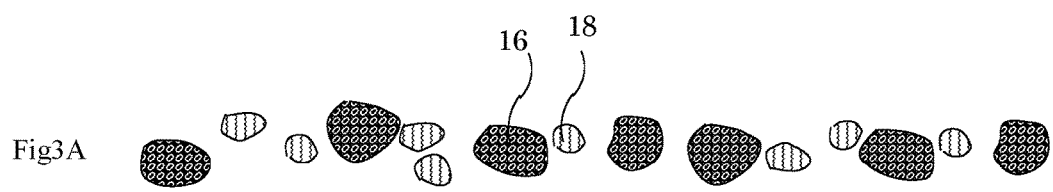
Fig3A
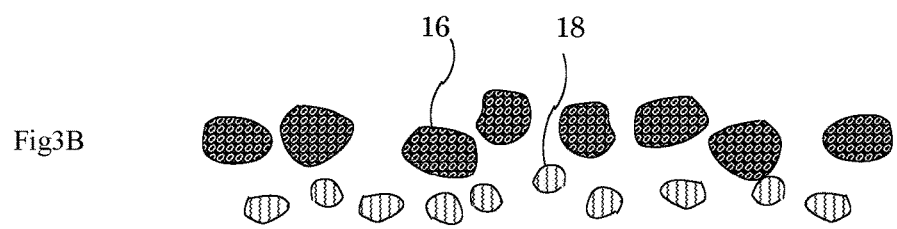
Fig3B
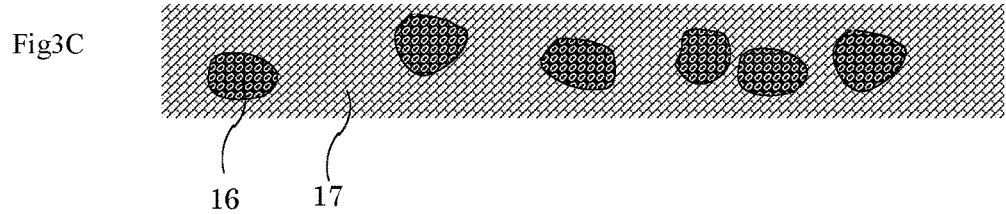
Fig3C
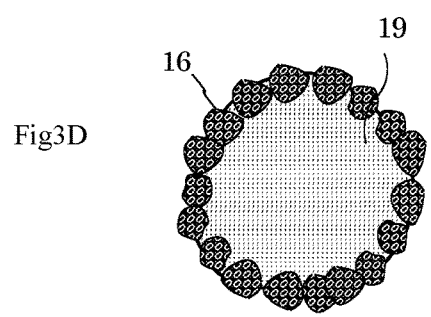
Fig3D

Fig5A

|  | Al | Mn | Ca |
|---|---|---|---|
| before polishing | 66.2% | 20.8% | 13.1% |
| after polishing | 59.1% | 27.3% | 13.7% |

Fig5B

|  | Al | Si | Ca |
|---|---|---|---|
| before polishing | 38.2% | 43.8% | 17.9% |
| after polishing | 41.2% | 42.3% | 16.5% |

Fig6A

| reaction promoter | PH value of the slurry | after 4 houers pH value of the slurry |
|---|---|---|
| none | 7.2 | 7.1 |
| $CaCO_3$ | 8.0 | 7.5 |
| $SrCO_3$ | 8.0 | 7.5 |
| $MgCO_3$ | 8.0 | 7.5 |
| $BaCO_3$ | 8.0 | 7.5 |
| $LiCO_3$ | 10.1 | 11.2 |
| $AlK(SO_4)_2$ | 4.6 | 4.2 |
| $NaHCO_3$ | 8.0 | 8.2 |
| $Ca_3(PO_4)_2$ | 9.0 | 9.6 |
| $CaCO_3 \cdot MnO_2$ integrated | 8.0 | 7.5 |
| $CaCO_3 \cdot Al_2O_3$ integrated | 8.0 | 7.5 |

Fig6B

| reaction promoter | polishing rate $\mu$m/min | pH value of the slurry(15%) | after 4 houers pH value of the slurry |
|---|---|---|---|
| $CaCO_3$ | 1.00 | 8.0 | 7.5 |
| $SrCO_3$ | 0.91 | 8.0 | 7.5 |
| $MgCO_3$ | 0.70 | 8.0 | 7.5 |
| $BaCO_3$ | 0.94 | 8.0 | 7.5 |
| $LiCO_3$ | 0.96 | 10.1 | 11.2 |
| $AlK(SO_4)_2$ | 0.72 | 4.6 | 4.2 |
| $NaHCO_3$ | 0.94 | 8.0 | 8.2 |
| $Ca_3(PO_4)_2$ | 0.96 | 9.0 | 9.6 |

Fig 7

| No | abrasive particle | media | surface plate | polishing rate ($\mu$m/min) |
|---|---|---|---|---|
| sample1-1 | SiC, MnO$_2$, CaCO$_3$ integrated | water | plastic pad | 0.76 |
| sample1-2 | Al$_2$O$_3$, MnO$_2$, CaCO$_3$ integrated | water | plastic pad | 0.72 |
| sample1-3 | ZrO$_2$, MnO$_2$, CaCO$_3$ integrated | water | plastic pad | 0.61 |
| sample1-4 | ZrSiO$_4$, MnO$_2$, CaCO$_3$ integrated | water | plastic pad | 0.50 |
| sample1-5 | mica, MnO$_2$, CaCO$_3$ integrated | water | plastic pad | 0.34 |
| sample1-6 | talc, MnO$_2$, CaCO$_3$ integrated | water | plastic pad | 0.31 |

Fig 8

| No | abrasive particle | media | surface plate | polising rate ($\mu$m/min) |
|---|---|---|---|---|
| sample1-1 | Al$_2$O$_3$, MnO$_2$, CaCO$_3$ integrated | water | plastic pad | 0.72 |
| sample3-1 | Al$_2$O$_3$, TiO$_2$, CaCO$_3$ integrated | water | plastic pad | 0.30 |
| sample3-2 | Al$_2$O$_3$, ZnO, CaCO$_3$ integrated | water | plastic pad | 0.31 |
| sample3-3 | Al$_2$O$_3$, NiO, CaCO$_3$ integrated | water | plastic pad | 0.30 |
| sample3-4 | Al$_2$O$_3$, SnO$_2$, CaCO$_3$ integrated | water | plastic pad | 0.29 |
| sample3-5 | Al$_2$O$_3$, Sb$_2$O$_3$, CaCO$_3$ integrated | water | plastic pad | 0.21 |
| sample3-6 | Al$_2$O$_3$, CuO, CaCO$_3$ integrated | water | plastic pad | 0.31 |
| sample3-7 | Al$_2$O$_3$, Co$_3$O$_4$, CaCO$_3$ integrated | water | plastic pad | 0.21 |
| sample3-8 | Al$_2$O$_3$, CeO$_2$, CaCO$_3$ integrated | water | plastic pad | 0.21 |
| sample3-9 | Al$_2$O$_3$, Pr$_6$O$_{11}$, CaCO$_3$ integrated | water | plastic pad | 0.19 |
| sample3-10 | Al$_2$O$_3$, Ti(Cr,Sb)O$_2$, CaCO$_3$ | water | plastic pad | 0.35 |
| sample3-11 | Al$_2$O$_3$, MnO$_2$ integrated | water | plastic pad | 0.31 |
| sample3-12 | CaCO$_3$, MnO$_2$ integrated | water | plastic pad | 0.33 |
| ref1 | Al$_2$O$_3$, CaCO$_3$ integrated | water | plastic pad | 0.00 |
| ref2 | Al$_2$O$_3$, MnO$_2$, CaCO$_3$ mixed | water | plastic pad | 0.00 |
| ref3 | MnO$_2$ | water | plastic pad | 0.00 |
| ref4 | Al$_2$O$_3$ | water | plastic pad | 0.00 |
| ref5 | CaCO$_3$ | water | plastic pad | 0.00 |
| ref6 | diamond 1-3 $\mu$m | oil | metal pad | 0.26 |

Fig9A

| No | abrasive particle | media | surface plate | polising rate ($\mu$m/min) |
|---|---|---|---|---|
| sample1-1 | $Al_2O_3$, $MnO_2$, $CaCO_3$ integrated | water | plastic pad | 1.01 |
| sample3-1 | $Al_2O_3$, $TiO_2$, $CaCO_3$ integrated | water | plastic pad | 0.42 |
| sample3-2 | $Al_2O_3$, ZnO, $CaCO_3$ integrated | water | plastic pad | 0.43 |
| sample3-3 | $Al_2O_3$, NiO, $CaCO_3$ integrated | water | plastic pad | 0.42 |
| sample3-4 | $Al_2O_3$, $SnO_2$, $CaCO_3$ integrated | water | plastic pad | 0.41 |
| sample3-5 | $Al_2O_3$, $Sb_2O_3$, $CaCO_3$ integrated | water | plastic pad | 0.29 |
| sample3-6 | $Al_2O_3$, CuO, $CaCO_3$ integrated | water | plastic pad | 0.43 |
| sample3-7 | $Al_2O_3$, $Co_3O_4$, $CaCO_3$ integrated | water | plastic pad | 0.29 |
| sample3-8 | $Al_2O_3$, $CeO_2$, $CaCO_3$ integrated | water | plastic pad | 0.29 |
| sample3-9 | $Al_2O_3$, $Pr_6O_{11}$, $CaCO_3$ integrated | water | plastic pad | 0.27 |
| sample3-10 | $Al_2O_3$, $Cr_2O_3$, $CaCO_3$ integrated | water | plastic pad | 0.63 |
| sample3-11 | $Al_2O_3$, $Fe_2O_3$, $CaCO_3$ integrated | water | plastic pad | 0.72 |
| ref6 | diamond1-3 $\mu$m | oil | metal pad | 0.41 |

Fig9B

| No | abrasive particle | media | surface plate | polising rate ($\mu$m/min) |
|---|---|---|---|---|
| sample1 | Al2O3, SiO2, CaCO3 integrated | water | plastic pad | 1.00 |
| sample2 | Al2O3, Fe2O3, CaCO3 integrated | water | plastic pad | 1.30 |
| sample3 | Al2O3, Cr2O3, CaCO3 integrated | water | plastic pad | 0.79 |
| ref1 | Al2O3 | water | plastic pad | 0.32 |
| ref2 | SiO2 | water | plastic pad | 0.01 |
| ref3 | CaCO3 | water | plastic pad | 0.00 |
| ref4 | Al2O3, SiO2 integrated | water | plastic pad | 0.40 |
| ref5 | Al2O3, CaCO3 integrated | water | plastic pad | 0.35 |
| ref6 | SiO2, CaCO3 integrated | water | plastic pad | 0.02 |
| ref7 | Al2O3, SiO2, CaCO3 mixed | water | plastic pad | 0.31 |
| ref8 | diamond1-3 $\mu$m | water | plastic pad | 0.30 |
| ref9 | diamond1-3 $\mu$m | oil | metal pad | 0.80 |

Fig10A

| | reaction promoter | polising rate μm/min | temperature of slurry |
|---|---|---|---|
| ref1 | none | 0.31 | 27°C |
| sample11 | CaCO$_3$ | 0.72 | 41°C |
| sample12 | SrCO$_3$ | 0.66 | 41°C |
| sample13 | MgCO$_3$ | 0.50 | 41°C |
| sample14 | BaCO$_3$ | 0.68 | 41°C |
| sample15 | LiCO$_3$ | 0.69 | 32°C |
| sample16 | AlK(SO$_4$)$_2$ | 0.52 | 30°C |
| sample17 | NaHCO$_3$ | 0.68 | 38°C |
| sample18 | Ca$_3$(PO$_4$)$_2$ | 0.69 | 38°C |
| sample19 | CaCO$_3$.MnO$_2$ integrated | 0.33 | 41°C |
| sample20 | CaCO$_3$.Al$_2$O$_3$ integrated | 0.35 | 41°C |

Fig10B

| | reaction of promoter | polising rate μm/min | temperatyre of slurry |
|---|---|---|---|
| ref1 | none | 0.40 | 27°C |
| exp1 | CaCO$_3$ | 1.00 | 41°C |
| exp2 | SrCO$_3$ | 0.91 | 41°C |
| exp3 | MgCO$_3$ | 0.70 | 41°C |
| exp4 | BaCO$_3$ | 0.94 | 41°C |
| exp5 | LiCO$_3$ | 0.96 | 32°C |
| exp6 | AlK(SO$_4$)$_2$ | 0.72 | 30°C |
| exp7 | NaHCO$_3$ | 0.94 | 38°C |
| exp8 | Ca$_3$(PO$_4$)$_2$ | 0.96 | 38°C |
| ref2 | CaCO$_3$ and Silica integrated | 0.35 | 41°C |
| ref3 | CaCO$_3$ and Alumina integrated | 0.02 | 41°C |

Fig11A

|  |  | Polishing Pressure | | |
|---|---|---|---|---|
|  | sample | 500 | 750 | 1000 |
| sample1 | $Al_2O_3$, $MnO_2$, $CaCO_3$ integrated | 0.72 ($\mu$m/min) | 0.92 ($\mu$m/min) | 1.39 ($\mu$m/min) |
| sample2 | $Al_2O_3$, $Fe_2O_3$, $CaCO_3$ integrated | 0.45 ($\mu$m/min) | 0.68 ($\mu$m/min) | 0.9 ($\mu$m/min) |
| sample3 | $Al_2O_3$, $Cr_2O_3$, $CaCO_3$ integrated | 0.66 ($\mu$m/min) | 0.99 ($\mu$m/min) | 1.32 ($\mu$m/min) |

Fig11B

|  |  | Polishing Pressure ($g/cm_2$) | | |
|---|---|---|---|---|
|  | sample | 160 | 300 | 500 |
| sample1 | Al2O3, SiO2, CaCO3 integrated | 1.00 ($\mu$m/min) | 1.86 ($\mu$m/min) | 3.05 ($\mu$m/min) |
| sample2 | Al2O3, Fe2O3, CaCO3 integrated | 1.30 ($\mu$m/min) | 2.32 ($\mu$m/min) | 3.91 ($\mu$m/min) |
| sample3 | Al2O3, Cr2O3, CaCO3 integrated | 0.79 ($\mu$m/min) | 1.43 ($\mu$m/min) | 2.34 ($\mu$m/min) |

Fig 12

| abrasive particle | polishing rate μm/min | surface roughness Ra nm |
|---|---|---|
| $SiO_2$ | 0.00 | 0.9 |
| $MnO_2$ | 0.01 | 1.5 |
| $CeO_2$ | 0.00 | 0.6 |
| $TiO_2$ | 0.00 | 1.0 |
| diamond 1-3 μm | 0.26 | 10.0 |
| $MnO_2$, $CaCO_3$ integrated | 0.33 | 0.4 |
| $Al2O_3$, $MnO_2$, $CaCO_3$ integrated | 0.72 | 1.0 |
| Mica, $MnO_2$, $CaCO_3$ integrated | 0.31 | 0.3 |

Fig 13

| abrasive particle + $H_2O_2$ | polishing rate μm/min | surface roughness Ra nm |
|---|---|---|
| $SiO_2+H_2O_2$ | 0.04 | 0.3 |
| $MnO_2+H_2O_2$ | 0.04 | 0.4 |
| $CeO_2+H_2O_2$ | 0.04 | 1.2 |
| $TiO_2+H_2O_2$ | 0.04 | 0.5 |

POLISHING ABRASIVE PARTICLE, PRODUCTION METHOD THEREFORE, POLISHING METHOD, POLISHING DEVICE, AND SLURRY

FIELD OF THE INVENTION

The present invention relates to an abrasive particle for polishing a surface of an object material such as sapphire, silicon carbide (SiC), or gallium nitride (GaN). The present invention also relates to a manufacturing method of the above abrasive particle. Further, the present invention also relates to a polishing method, a polishing device, and slurry for polishing.

BACKGROUND OF THE INVENTION

In recent years, multifunctional and high-performance semiconductor devices are continuously proposed. In response to the proposals, materials other than silicon (Si) are newly adopted to the substrate of the semiconductor device. Among those substrate materials, sapphire, SiC (for power device), and GaN (for light-emitting diode (LED)) etc. draw special attention to meet the proposals. On the other hands, it is desired to develop new processing methods of substrate, in order to achieve a mass-production of more high-performance devices at low cost.

In a manufacturing process of the semiconductor device, a polishing process is performed to flat the surface of the semiconductor substrate. In a conventional polishing process, oil slurry including diamond abrasive particles is used. Specifically, the surface of the semiconductor substrate formed from silicon carbide is mechanically polished by the diamond abrasive particles harder than silicon carbide. Since the polishing rate of this process is high, the polishing amount reaches a target amount in a short period of time. However, there is a risk of greatly damaging the surface of the substrate. In short, it is difficult to obtain a high quality of polishing surface. Furthermore, since the quality of the oil slurry is changed by the heat generated during the polishing process, the diamond abrasive particles contained in the slurry aggregate. As the result, the expensive diamond particles cannot be reused.

To solve the above problem, a polishing method utilizing a mechanochemical effect has been introduced (Patent Document 1). In the mechanochemical polishing, the surface of the object material is altered, and then polished by abrasive particles softer than the object material. Thus, the surface of the object material is not damaged so much. Further, in order to improve the polishing rate, techniques polishing silicon carbide with oxidizing agent are introduced (Patent Documents 2, 3 and 4).

PRIOR ART DOCUMENT

Patent Document

[Patent Document 1] Japanese patent application publication No. 2005-81485
[Patent Document 2] Japanese patent No. 4345746
[Patent Document 3] Japanese patent No. 4827963
[Patent Document 4] WO201113687

SUMMARY OF THE INVENTION

Problem to be Resolved by the Invention

In the dry polishing method disclosed at Patent Document 1, heat is generated due to the friction between the object material and the abrasive particles. The high frictional heat accelerates a mechanochemical polishing. Thus, the polishing rate is improved. However, the abrasive particles and waste generated due to the polishing have been exposed to the high frictional heat. So, the abrasive particles and the waste adhere to the inside of the polishing device. Thus, there is the problem that it takes time to clean up the device and therefore the productivity is decreased.

On the other hands, in the wet polishing method disclosed in Patent Documents 2 and 3, oxidizing agent such as hydrogen peroxide is added to slurry to oxidize the surface of the object material. Herewith, the polishing rate is improved. However, the slurry including the oxidizing agent may deteriorate a working environment and increase the liquid-waste treatment cost. Moreover, the oxidizing agent possibly corrodes the polishing device. In the wet polishing method disclosed at Patent Document 4, strong alkaline slurry is used to accelerate the mechanochemical polishing, that is, to improve the polishing rate. However, the strong alkaline slurry of pH 10 to 14 may deteriorate the working environment and increase the liquid-waste treatment cost. Anyway, in the above methods, the property of the slurry tends to change during the polishing process. This necessitates monitoring and adjustment of the process by workers, making an automation of the process impossible. Accordingly, in the conventional methods, it is difficult to polish SiC or GaN having high corrosion-resistance with high quality, at a practically high polishing rate.

To solve the problem described above, the present invention is objected to provide abrasive particles and its production method capable of polishing the object material with high quality at high polishing rate, while employing the wet polishing method and the polishing method inducing the mechanochemical effect. Additionally, the present invention is objected to provide environment-friendly abrasive slurry, a wet polishing method and a polishing device which use the environment-friendly abrasive slurry.

Means of Solving of the Problems

The following configurations are to solve the above problem.

<Configuration 1>

An abrasive particle including: a first polishing component having a Mohs' hardness equal to or lower than an object material; and a second polishing component for chemically altering the object material, wherein the first polishing component and the second polishing component are integrated to a particle using a mechanical alloying process.

<Configuration 2>

The abrasive particle according to configuration 1, wherein the first polishing component has a weight not less than 5% and not more than 95% for the weight of the integrated particle.

<Configuration 3>

The abrasive particle according to configuration 1, wherein the second polishing component has a weight not less than 5% and not more than 95% for the weight of the integrated particle.

<Configuration 4>

The abrasive particle according to any one of configurations 1-3, wherein the integrated particle has a size not less than 0.05 µm and not more than 100 µm.

<Configuration 5>

An abrasive particle including: a first polishing component having a mechanical polishing property; and a second polishing component having a chemical polishing property, wherein the first polishing component and the second polishing component are integrated to a particle using a mechanical alloying process.

<Configuration 6>

The abrasive particle according to any one of configurations 1-5, the integrated particle includes a plurality kind of inorganic compounds joined with each other using the mechanical alloying process, and wherein the plurality kind of inorganic compounds are integrated to a particle through an amorphous layer, while maintaining inherent material properties respectively.

<Configuration 7>

The abrasive particle according to configuration 6, wherein each inorganic compound is partially exposed to an outer surface of the integrated particle.

<Configuration 8>

The abrasive particle according to configuration 6 or 7, wherein the plurality kind of inorganic compounds includes a chemical polishing component for inducing a mechanochemical effect on the object material.

<Configuration 9>

The abrasive particle according to configuration 8, wherein each of the plurality kind of inorganic compounds has a Mohs' hardness equal to or lower than the object material.

<Configuration 10>

The abrasive particle according to configuration 8, wherein the plurality kind of inorganic compounds further includes a mechanical polishing component for mechanically polishing a surface of the object material in which the mechanochemical effect is induced.

<Configuration 11>

The abrasive particle according to configuration 10, wherein the mechanical polishing component has a Mohs' hardness equal to or lower than the object material.

<Configuration 12>

The abrasive particle according to configuration 10, wherein the chemical polishing component induces the mechanochemical effect on the object material by oxidizing the surface of the object material in response to a friction heat generated during a polishing process.

<Configuration 13>

The abrasive particle according to configuration 10, wherein one or more insoluble salt among lithium carbonate, alkali carbonate, phosphate, fluorine compound, boron compound, halogen compound such as silver chloride, silver bromide, and silver iodide, a cryolite, and an alum is employed as the chemical polishing component.

<Configuration 14>

A manufacturing method of an abrasive particle including: mixing a plurality kind of inorganic compounds; and performing a mechanical alloying process in a dry polishing method to integrate the plurality kind of inorganic compounds to a particle through an amorphous layer.

<Configuration 15>

A polishing method for polishing the object material with a slurry produced by scattering the abrasive particle according to any one of configurations 1-12 into pure water.

<Configuration 16>

A polishing member manufactured by scattering and fixing the abrasive particle according to any one of configurations 1-12 on a base material.

<Configuration 17>

A polishing device including: an abrasive pad formed from any one of synthetic fiber, glass fiber, natural fiber, synthetic resin, and natural resin, the abrasive particle according to any one of configurations 1-12 being scattered on a surface of the abrasive pad; a holding device for pressing the object material against the surface of the abrasive pad with an elastic force; and a liquid pourer for providing pure water for a surface to be polished of the object material, wherein the elastic force of the holding device is set to a level capable of generating, between the abrasive particle and the object material, a friction heat equal to or higher than a temperature at which the reaction promotor occurs a chemical action.

<Configuration 18>

A slurry for polishing silicon carbide or gallium nitride, the slurry being a suspension produced by scattering the abrasive particle according to any one of configurations 1-12 into water having neutral pH, pH of the slurry being set to a value not less than 4 and not more than 11 at a temperature of 25° C.

<Configuration 19>

An abrasive particle for polishing sapphire in a wet polishing method including: a first polishing component having a particle shape and having a Mohs' hardness not less than 7 and not more than 9; a second polishing component having a particle shape and having a chemical polishing property for inducing a mechanochemical effect on an object material; and a friction heat reaction component having a particle shape, produced from alkali metal salt or an alkaline earth metal salt, and insoluble to pure water used in a slurry, wherein the first polishing component, the second polishing component, and the friction heat reaction component are integrated to a particle using a mechanical alloying process.

<Configuration 20>

The abrasive particle according to configuration 19, wherein one of $Al_2O_3$, $ZrSiO_4$, and $ZrO_2$ is employed as the first polishing component, and wherein the first polishing component has a weight not less than 5% and not more than 95% for the weight of the integrated particle.

<Configuration 21>

The abrasive particle according to configuration 19, wherein one or more of $Cr_2O_3$, $Fe_2O_3$, and $SiO_2$ is employed as the second polishing component, and wherein the second polishing component has a weight not less than 5% and not more than 95% for the weight of the integrated particle.

<Configuration 22>

The abrasive particle according to configuration 19, wherein, when $SiO_2$ is employed as the second polishing component, a component having a Mohs' hardness higher than $SiO_2$ is employed as the first polishing component.

<Configuration 23>

The abrasive particle according to configuration 19, wherein one or more of $CaCO_3$, $SrCO_3$, $MgCO_3$, $BaCO_3$, $Li_2Co_3$, $Ca_3(PO_4)_2$, $Li_3PO_4$, and $AlK(SO_4)_2$ is employed as the friction heat reaction component, and wherein the friction heat reaction component has a weight not less than 5% and not more than 95% for the weight of the integrated particle.

<Configuration 24>

The abrasive particle according to configuration 19, wherein one of $Al_2O_3$, $ZrSiO_4$, and $ZrO_2$ is employed as the first polishing component, wherein one or more of $Cr_2O_3$, $Fe_2O_3$, and $SiO_2$ is employed as the second polishing component, and wherein one or more of $CaCO_3$, $SrCO_3$, $MgCO_3$, $BaCO_3$, $Li_2CO_3$, $Ca_3(PO_4)_2$, $Li_3PO_4$, and $AlK(SO_4)_2$ is employed as the friction heat reaction component.

<Configuration 25>

The abrasive particle including: the first polishing component according to configuration 1 or 6; the second polishing component according to configuration 1 or 6; and the friction heat reaction component according to configuration 1 or 6, wherein the first polishing component, the second polishing component, and the friction heat reaction component are integrated to a particle using the mechanical alloying process, and wherein the integrated particle has a size not less than 0.05 μm and not more than 100 μm.

<Configuration 26>

The abrasive particle including: the first polishing component according to configuration 19 or 24; the second polishing component according to configuration 19 or 24; and the friction heat reaction component according to configuration 19 or 24, wherein the first polishing component, the second polishing component, and the friction heat reaction component are integrated to a particle using the mechanical alloying process, and wherein the integrated particle has a size not less than 0.05 μm and not more than 100 μm.

<Configuration 27>

A polishing method for polishing, in a wet polishing method, the object material with slurry produced by scattering the abrasive particle according to configuration 19 or 24 into pure water.

<Configuration 28>

A polishing method for sapphire in which a composition of the abrasive particle according to configuration 19 or 24 is determined so that pH of slurry is not less than 5 and not more than 9 when 15% by weight of the abrasive particle according to configuration 19 or 24 is scattered in 100 ml of pure water.

<Configuration 29>

A slurry for polishing, in a wet polishing method, sapphire, an apparent specific volume (in standing) of the abrasive particle according to configuration 19 or 24 is adjusted to equal to or more than 0.5 ml/g and equal to or less than 200 ml/g in the slurry.

<Configuration 30>

A polishing device including: an abrasive pad formed from any one of synthetic fiber, glass fiber, natural fiber, synthetic resin, and natural resin, the abrasive particle according to any one of configurations 9-11 being scattered and fixed on a surface of the abrasive pad; a pourer for providing the slurry according to any one of configurations 9-11 on the abrasive pad; a pressing device for pressing an object material against the abrasive pad with an elastic force to generate a friction heat between the abrasive particle scattered on the abrasive pad and the object material.

<Configuration 31>

A polishing device including: a pourer for providing pure water on an abrasive pad formed from any one of synthetic fiber, glass fiber, natural fiber, synthetic resin, and natural resin, and on which the abrasive particle according to configuration 1 or 6 is scattered and fixed; and a pressing device for pressing an object material against the abrasive pad with an elastic force to generate a friction heat between the abrasive particle scattered on the abrasive pad and the object material.

<Configuration 32>

An abrasive particle for polishing an object material formed from silicon carbide or gallium nitride including: a chemical polishing component for exerting a chemical polishing action to the object material; and a reaction promotor for promoting the chemical polishing action in response to a friction heat generated when the object material is polished, wherein the chemical polishing component and the reaction promotor are integrated to a particle using a mechanical alloying process, while maintaining inherent material properties respectively.

<Configuration 33>

An abrasive particle for polishing an object material formed from a silicon carbide or a gallium nitride including: a mechanical polishing component for exerting a mechanical polishing action to the object material; and a chemical polishing component for exerting a chemical polishing action to the object material, wherein the mechanical polishing component and the chemical polishing component are integrated to a particle using a mechanical alloying process, while maintaining inherent material properties respectively.

<Configuration 34>

An abrasive particle for polishing an object material formed from a silicon carbide or a gallium nitride including: a mechanical polishing component for exerting a mechanical polishing action to the object material; a chemical polishing component for exerting a chemical polishing action to the object material; and a reaction promotor for promoting the chemical polishing action in response to a friction heat generated when the object material is polished, wherein the mechanical polishing component and the chemical polishing component are integrated to a particle using a mechanical alloying process, while maintaining inherent material properties respectively.

<Configuration 35>

An abrasive particle for polishing an object material formed from a silicon carbide or a gallium nitride including: an oxidizing component for oxidizing a polishing surface of the object material in response to a friction heat generated during the polishing process; and a reaction promotor for promoting the oxidization of the polishing surface with the frictional heat, wherein the oxidizing component and the reaction promotor are integrated to a particle using a mechanical alloying process, while maintaining inherent material properties respectively.

<Configuration 36>

An abrasive particle for polishing an object material formed from a silicon carbide or a gallium nitride including: an oxidizing component for oxidizing a polishing surface of the object material in response to a friction heat generated during the polishing process; a reaction promotor for promoting the oxidization of the polishing surface with the frictional heat; and a mechanical polishing component for mechanically removing the oxidized polishing surface, wherein the oxidizing component, the reaction promotor, and the removing component are integrated to a particle using a mechanical alloying process, while maintaining inherent material properties respectively.

<Configuration 37>

The abrasive particle according to any one of configurations 33, 34 and 36, wherein SiC, $Al_2O_3$, $ZrSiO_4$, $ZrO_2$, or the other silicate compound is employed as the mechanical polishing component, and wherein the mechanical polishing component has a modified Mohs' hardness not less than 9 and not more than 13, and has a weight not less than 5% and not more than 95% for the weight of the integrated particle.

<Configuration 38>

The abrasive particle according to any one of configurations 33, 34 and 36, wherein talc, mica, or the other silicate compound is employed as the mechanical polishing component, and wherein the mechanical polishing component has a modified Mohs' hardness less than 9, and has a weight not less than 5% and not more than 95% for the weight of the integrated particle.

<Configuration 39>

The abrasive particle according to any one of configurations 32-34, wherein an oxide material or a multiple oxide material of transition metal element, which belongs to third to eleventh group of periodic table except Zr, or an oxide or a multiple oxide material of twelfth group element (zinc group element) of periodic table, is employed as the chemical polishing component, and wherein the chemical polishing component has a weight not less than 5% and not more than 95% for the weight of the integrated particle.
<Configuration 40>
The abrasive particle according to any one of configurations 32-34, wherein $MnO_2$ is employed as the chemical polishing component, and wherein the chemical polishing component has a weight not less than 5% and not more than 95% for the weight of the integrated particle.
<Configuration 41>
The abrasive particle according to any one of configurations 32-34, wherein alkali metal salt or alkaline earth metal salt, which is insoluble to pure water, is employed as the reaction promotor, and wherein the reaction promotor has a weight not less than 5% and not more than 95% for the weight of the integrated particle.
<Configuration 42>
The abrasive particle according to any one of configurations 33-36, wherein $CaCO_3$ is employed as the reaction promotor, and wherein the reaction promotor has a weight not less than 5% and not more than 95% for the weight of the integrated particle.
<Configuration 43>
The abrasive particle according to any one of configurations 32-42, wherein the integrated particle for polishing silicon carbide or gallium nitride in a wet polishing method has a size not less than 0.05 μm and not more than 100 μm.
<Configuration 44>
The abrasive particle according to any one of configurations 32-42, wherein each component contained in the integrated particle is partially exposed to an outer surface of the integrated particle.
<Configuration 45>
A manufacturing method of an abrasive particle comprising: integrating two or more components for exerting a polishing action for an object material formed of silicon carbide or gallium nitride using a mechanical alloying process.
<Configuration 46>
A polishing method comprising: polishing carbide or gallium nitride with the abrasive particle according to any one of configurations 32-44 scattered into pure water.
<Configuration 47>
A polishing method for polishing an object material formed from silicon carbide or gallium nitride comprising: partially providing pure water on a surface of the object material with which the abrasive particle according to any one of configurations 32-44 contacts.
<Configuration 48>
A polishing device including: an abrasive pad formed from any one of synthetic fiber, glass fiber, natural fiber, synthetic resin, and natural resin, the abrasive particle according to any one of configurations 32-36 being scattered and fixed on a surface of the abrasive pad;
a holding device for pressing the object material against the surface of the abrasive pad with an elastic force; and a liquid pourer for providing pure water on a surface to be polished of the object material, wherein the elastic force of the holding device is set to a level capable of generating, between the abrasive particle and the object material, a friction heat equal to or higher than a temperature at which the reaction promotor occurs a chemical action.

<Configuration 49>
A slurry for polishing silicon carbide or gallium nitride, the slurry being suspension produced by scattering the abrasive particle according to any one of configurations 32-36 into water having neutral pH, pH of the slurry being set to a value not less than 4 and not more than 11 at a temperature of 25° C.

Effect of the Present Invention

In the abrasive particles of the present invention, several kinds of component are directly joined with each other and integrated to particles using mechanical alloying process. Since the biding energy between components joined using the mechanical alloying process is strong, the integrated particles will not decompose during the polishing process. Further, since the mechanochemical effect is induced on the surface of the object material by components exerting a chemical abrasive action, it becomes possible to polish the object material at high polishing rate with the abrasive particle having a Mohs' hardness lower than the object material. Further, a reaction promoter accelerates the chemical abrasive action by reacting to the heat generated in a friction between the outer surface of the abrasive particle and the surface of the object material. Therefore, the polishing rate is further improved.

Several kinds of component are joined together (integrated to an abrasive particle), while maintaining the respective inherent material properties. Therefore, each abrasive particle can exert its own function serially. As the result, the polishing process is accelerated.

If a component having a relatively high rigidity is employed for a mechanical polishing, it makes possible to polish the object material at a high speed. On the other hand, if a component having a relatively low rigidity is employed for the mechanical polishing, it makes possible to polish the object material with high quality.

The slurry produced by scattering the above described abrasive particles into pure water is almost harmless and does not affect badly on a working environment. Further, the liquid-waste treatment of the slurry is also easy. Additionally, since only a little amount of component of the abrasive particles is consumed during the polishing process, the slurry can be used repeatedly, and then it is also economical.

Generally, in a conventional wet polishing method utilizing slurry such as water etc., the chemical abrasive action cannot be fully exerted, since the thermal energy is diffused. On the other hand, by using the abrasive particle of the present invention, where the several kinds of component are integrated, thermal energy can be utilized efficiently and it can exert the chemical abrasive action sufficiently, even in the wet polishing method.

BRIEF DESCRIPTION OF DRAWINGS

FIG. 3 is an explanatory figure showing a conventional mechanochemical polishing method.

FIG. 5 shows comparisons of components ratio of abrasive particles of the embodiment before/after polishing process.

FIG. 6 shows comparisons of liquid-waste drained after the polishing process with various abrasive particles.

FIG. 7 shows comparisons of polishing rate in polishing SiC when various kinds are employed as the first component.

FIG. 8 shows comparisons of polishing rate in polishing SiC when various kinds are employed as the second component.

FIG. 9 shows comparisons of polishing rate in polishing GaN and sapphire.

FIG. 10 shows relationships between polishing rate for polishing SiC and temperature of slurry after the polishing process with using various reaction promoters.

FIG. 11 shows relationships between a polishing pressure and a polishing rate.

FIG. 12 shows relationships between a polishing rate of various kinds of abrasive particle and a surface roughness.

FIG. 13 shows the relationships between a polishing rate of comparative examples and a surface roughness.

DESCRIPTION OF THE PREFERRED EMBODIMENT

Figure 1A:
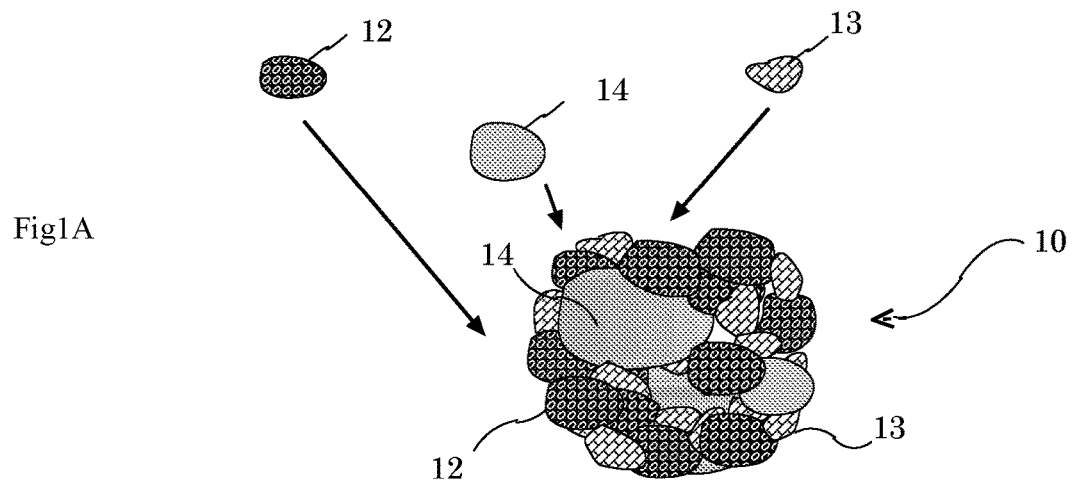
FIG. 1 is a schematic view showing an external structure of an abrasive particle of the present invention.
Figure 1B:
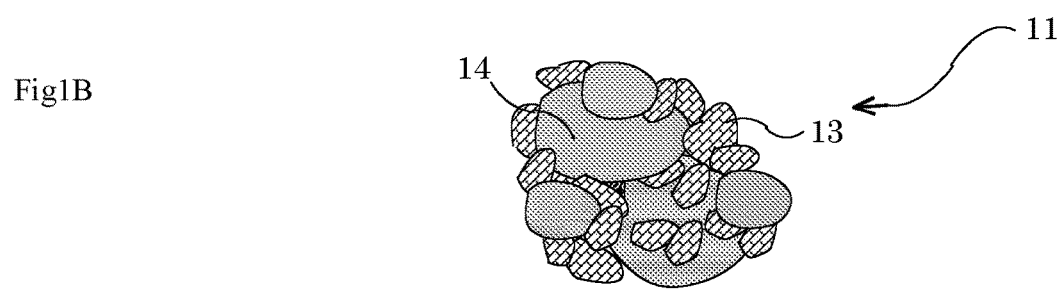

FIG. 1 is a schematic view showing an external structure of an abrasive particle of the present invention.

An abrasive particle 10 of the present invention is used to polish various object materials such as sapphire, silicon carbide, and gallium nitride. As shown in the FIG. 1A, the abrasive particle 10 includes first components 12, second components 13, and reaction promoters 14. The first components 12, the second components 13, and the reaction promoters 14 are joined with each other using a mechanical alloying process, while maintaining inherent material properties of them. The first component 12 exerts a mechanical polishing action to an object material. The second component 13 exerts a chemical polishing action to the object material. The reaction promoter 14 promotes the chemical polishing action in response to the friction heat generated when the object material is polished. These components are integrated to constitute the abrasive particle 10.

Further, an abrasive particle 11 (FIG. 1B) consisting of only the second component 13 and the third component (reaction promotor) 14 will be described later. Furthermore, any combination of these components is possible. The chemical polishing action includes an action for inducing a mechanochmical effect to alter the surface of the object material. The chemical polishing action also includes an action for oxidizing the polishing surface of the object material in response to the friction heat generated during the polishing process. Due to these actions, the rigidity of the surface of the object material is lowered for polishing.

The combination of the second component, which oxidizes the polishing surface of the object material in response to the friction heat generated during the polishing process, and the third component, which promotes the oxidization of the polishing surface with the frictional heat, is also satisfactory practical.

Figure 1C:
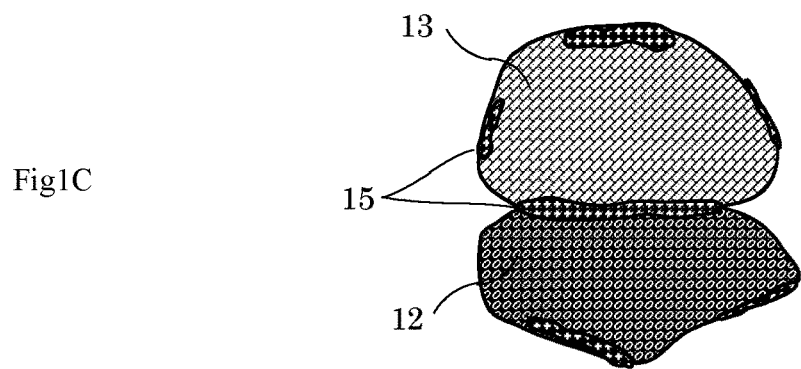

As described above, in the present invention, several kinds of components are joined (integrated) each other. This means that these components are adjoined without any other connecting material such as adhesive agent. When several components are joined together using the mechanical alloying process, amorphous layers 15 are formed on the boundary surface between the components, as illustrated in FIG. 1C. These components are joined together through the amorphous layer 15. In other words, each inorganic compound component is joined by a chemical activity of the amorphous layer 15 generated on the crystalline surface using the mechanical alloying process. The binding force between compounds is so strong that each component of inorganic compound does not separate easily throughout the polishing process. Thus, when each component of the abrasive particle comes into contact with the object material, the property of each component of the abrasive particle is exerted serially. As shown in FIG. 1C, the amorphous layers 15, which can be formed everywhere on the crystalline surface of the second component and the third component, also have the effect of promoting the chemical abrasive action of these components.

The size and shape of the integrated particle is determined to those suitable to the polishing. If a surface roughness not more than 0.01 μm is required in lapping process of silicon carbide substrate or gallium nitride substrate, the average particle size should be set not more than 10 μm. When the abrasive particle of the present invention is used in the wet polishing, the desirable average particle size is not less than 0.05 μm and not more than 100 μm. In a case that the abrasive particle is used while being fixed on an abrasive pad or a grinder, the average particle size may become larger than the above. Thus, the abrasive particle of the present invention can meet various level of surface roughness.

While the abrasive particle is integrated to make a lump, the external shape of each abrasive particle is not necessarily spherical. Several kinds of component are joined together using the mechanical alloying process, while each component maintaining the inherent material properties. The purpose of joining several components is to utilize the inherent material property of each component in the polishing process. In any case, when employing the wet polishing method, the present invention does not use chemical slurry, which includes acid, alkali, or oxidizing agent and the like. Instead, pH neutral water is used as a scattering medium of the abrasive particle.

<Mechanical Alloying Process>

In the mechanical alloying process, repeated mechanical impacts including fracturing, rubbing, compressing, stretching, hitting, bending, and crashing etc. are given to the mixture of the first component 12 powder, the second component 13 powder, and the reaction promoter 14 powder. Any impact or any combination among these impacts can be applied. By the mechanical impact, these powders are broken and blended with each other evenly. Thereafter, some of the blended powder is integrated. The components are joined each other and integrated into a lump of powder, while maintaining the inherent material properties. These components are joined together through the amorphous layer 15.

<Action of First Component>

The first component 12 exerts the mechanical abrasive action to the object material. The Mohs' hardness (modified Mohs' hardness) of the first component 12 is selected according to the rigidity of the object material. For example, when polishing silicon carbide or gallium nitride, appropriate Mohs' hardness of the first component 12 is not less than 7 and not more than 13. The minimum rigidity level of the first component 12 for performing the mechanical polishing at high speed is 7. The maximum rigidity level of the first component 12 for preventing the surface of the object material (silicon carbide or gallium nitride) from being damaged is 13 equal to that of silicon carbide or gallium nitride. Suitable material for the first component 12 is silicate compound including SiC, $Al_2O_3$, $ZrSiO_4$, $ZrO_2$, talc, or mica. Silicate salt compound is not restricted to the above. Other silicate compounds are also applicable. In order to attain a high polishing rate, SiC, $Al_2O_3$, $ZrSiO_4$, or $ZrO_2$, whose modified Mohs' hardness is not less than 9 and not more than 13, are suitable. On the other hand, in order to obtain a high quality of polishing surface, softer silicate compound such as talc and mica, whose modified Mohs' hardness is less than 9, are suitable. Note that, to polish sapphire, whose Mohs' hardness is 9, the suitable Mohs' hardness of abrasive particle is not less than 7 and not more than 9.

Assuming that the whole weight of the integrated abrasive particle is 100% by weight, it is desirable that the weight of the first component 12 is not less than 5% and not more than 95% by weight. Note that if the ratio of the first component 12 is less than 5% by weight, the rigidity of the abrasive particle can become insufficient. Further, if the ratio of the first component 12 is more than 95% by weight, the amount of the second component 13 which exerts the chemical abrasive action can become insufficient. As the result, the polishing rate may not be improved sufficiently.

<Action of Second Component>

The second component 13 acts to induce the mechanochemical effect to the object material. The mechanochemical effect includes at least severing the bindings between molecules or atoms, oxidizing molecules or atoms, replacing some of molecules or atoms with others, on the surface of the object material. In this way, the surface of the object material is altered chemically. This makes possible to strip off the chemically altered part of the object material by using the abrasive particle having rigidity level equal to or lower than that of the object material. Thus, the surface of the object material is polished to be flat. Therein, a large scarring will not be left on the object material, since only the outer surface is stripped off. This action of the second component helps to attain a high polishing rate (removal amount per unit time) in the polishing process.

To polish silicon carbide or gallium nitride, it is desirable to employ one or more kinds of oxide material as the second component 13, from the following materials such as $Cr_2O_3$, $Fe_2O_3$, $TiO_2$, $ZnO$, $NiO$, $SnO_2$, $Sb_2O_3$, $CuO$, $Co_3O_4$, $CeO_2$, $Pr_6O_{11}$, and $MnO_2$. This means that the second component 13 is oxide material or multiple oxide material of transition metal element, which belongs to the third to the eleventh group of the periodic table except Zr, otherwise oxide or multiple oxide material of the twelfth group element (zinc group element) of the periodic table. Multiple oxide material is solid solution of more than two kinds of oxide materials among of the above.

Oxide materials capable of easily oxidizing silicon carbide or gallium nitride at a high temperature can be employed as the second component 13. Any of the above listed second components 13 is oxide material. Manganese dioxide ($MnO_2$) is widely known as the solid oxidizing agent having a strong activity. $MnO_2$ produced through an electrolytic process is especially suitable as the second component. In response to the friction heat generated during the polishing process, $MnO_2$ oxidizes the C surface of silicon carbide and causes solid phase reaction with the Si surface. In this way, the oxidized polishing surface can be removed mechanically by the component whose Mohs' hardness is equal to or lower than that of silicon carbide, with a great efficiency.

To polish sapphire, it is desirable to employ, as the second component 13, a material which is easy to be isomorphic-replaced with aluminum ion ($Al_3^+$) of sapphire and whose ionic radius is approximate to that of aluminum (Al). On the other hand, Silica ($SiO_2$) is isomorphic-replaced when the siloxane is dehydrated. In response to this chemical reaction, the surface of the object material (i.e. sapphire) is altered. Thus, an efficient polishing by using the first abrasive agent having even or lower rigidity than that of the object material becomes possible. Assuming that the whole weight of the integrated particle is 100, the desirable ratio of the second component 13 is not less than 5 and not more than 95% by weight. Note that when if second component 13 is less than 5% by weight, the amount of the second component which exerts the chemical abrasive action can become insufficient. As the result, the polishing rate may not be improved sufficiently. Further, if the second component 13 is more than 95% by weight, the rigidity of the entire abrasive particle can become insufficient.

<Action of Reaction Promoter>

The reaction promoter 14 is produced from alkali metal salt or alkaline earth metal salt. Further, the reaction promoter 14 is insoluble to the pure water used in the slurry. The reaction promoter 14 is not liquid but solid state material. Therefore, the reaction promoter 14 can be integrated with the first component 12 and the second component 13 by the mechanical energy to produce the joined abrasive particle. If the reaction promoter 14 is liquid state or water-soluble material, the abrasive particles will dissolve into the slurry and then make the liquid-waste harmful.

It is desirable to select, as the material of the reaction promoter 14, one or more kinds of materials from the following material group: $CaCO_3$, $SrCO_3$, $MgCO_3$, $BaCO_3$, $LiCo_3$, $Ca_3(PO_4)_2$, $Li_3PO_4$, and $AlK(SO_4)_2$. These materials, which are suitable for reaction promoter 14, are alkali metal salt or alkaline earth metal salt and also insoluble to pure water. Any of them is capable of promoting the chemical polishing action of the second component 13 with friction heat generated during the polishing process. Other than the above, inorganic compounds of such materials as $CaF_2$, $Na_3AlF_6$, $Na_2B_4O_7$, $AgCl$, $AgBr$, $AgI$, which are stable in atmosphere and insoluble to pure water, are also suitable to the material of the reaction promoter 14.

Specifically, the materials (except for $LiCo_3$ and $AlK(SO_4)_2$) to be employed for the reaction promoter 14 have water solubility of not more than 0.1. In other words, the amount to be dissolved in 100 g of pure water at a temperature of 25° C. is not more than 0.1 g. On the other hand, $LiCo_3$ and $AlK(SO_4)_2$ have water solubility (i.e. 1.33 and 6.74 respectively) higher than the other materials mentioned the above. However, in the present embodiment, since the reaction promoter 14 is integrated with the other components in the abrasive particle using the mechanical alloying process, the integrated particles are hardly separated and dissolved into water. Accordingly, the abrasive particle including the reaction promoter 14 can be used repeatedly in slurry. Note that the insoluble material in the present invention means the material which cannot dissolve more than 7.0 g in 100 g of pure water at a temperature of 25° C.

Assuming that the whole weight of the integrated particle is 100, it is preferable that the ratio of the reaction promoter 14 is not less than 5 and not more than 95% by weight. When the reaction promoter 14 is less than 5% by weight, the chemical polishing action of the second component 13 cannot be promoted sufficiently. When the reaction promoter 14 is more than 95% by weight, the amount of the second component 13 becomes insufficient.

Considering the case where lithium carbonate or alkali carbonate is employed as the reaction promoter 14. When the wet polishing is performed with the abrasive particle of the present invention, the abrasive particle is rubbed against the object material and friction heat is generated at the place subject to the rubbing. As the result, carbon dioxide is separated from the lithium carbonate or the alkali carbonate to yield oxidized lithium or oxidized alkali. Thereafter, the oxidized lithium or the oxidized alkali immediately reacts to water while generating high hydration heat. As the result, lithium hydroxide or alkaline-earth hydroxide, which is strong alkaline material, is produced.

This chemical reaction occurs in a minute area of the surface of the object material, where the object material comes into contact with the abrasive particle. Since the abrasive particle includes both of the component for inducing the mechanochemical effect and the component capable of exerting mechanical polishing action, the mechanochemical effect and the mechanical polishing action are exerted serially. As the result, the polishing surface can be removed effectively.

When alum ($AlK(SO_4)_2$) is employed as the reaction promoter 14, acid areas for prompting the mechanochemical effect are formed on the surface of the object material by the friction heat.

When fluorine compound or halogen compound is employed as the reaction promoter 14, it is considered that the following reactions occur.

Near the surface of the object material of Si system, atoms are in a state called dangling bond. Since the atom which is in the state of dangling bond has electrons which are not covalently-bonded, the electrons become instable and chemically active. On the other hands, when the abrasive particle is rubbed against the surface of the object material, fluorine ion is yielded due to the friction heat. Then, the atom which is in the state of dangling bond and the fluorine ion are bonded together. Consequently, the fluorine atoms having strong electronegativity warp the crystalline structure of the surface of the object material. In this way, the mechanochemical effect on the surface of the object material is promoted.

<Polishing Device>

Figure 2:
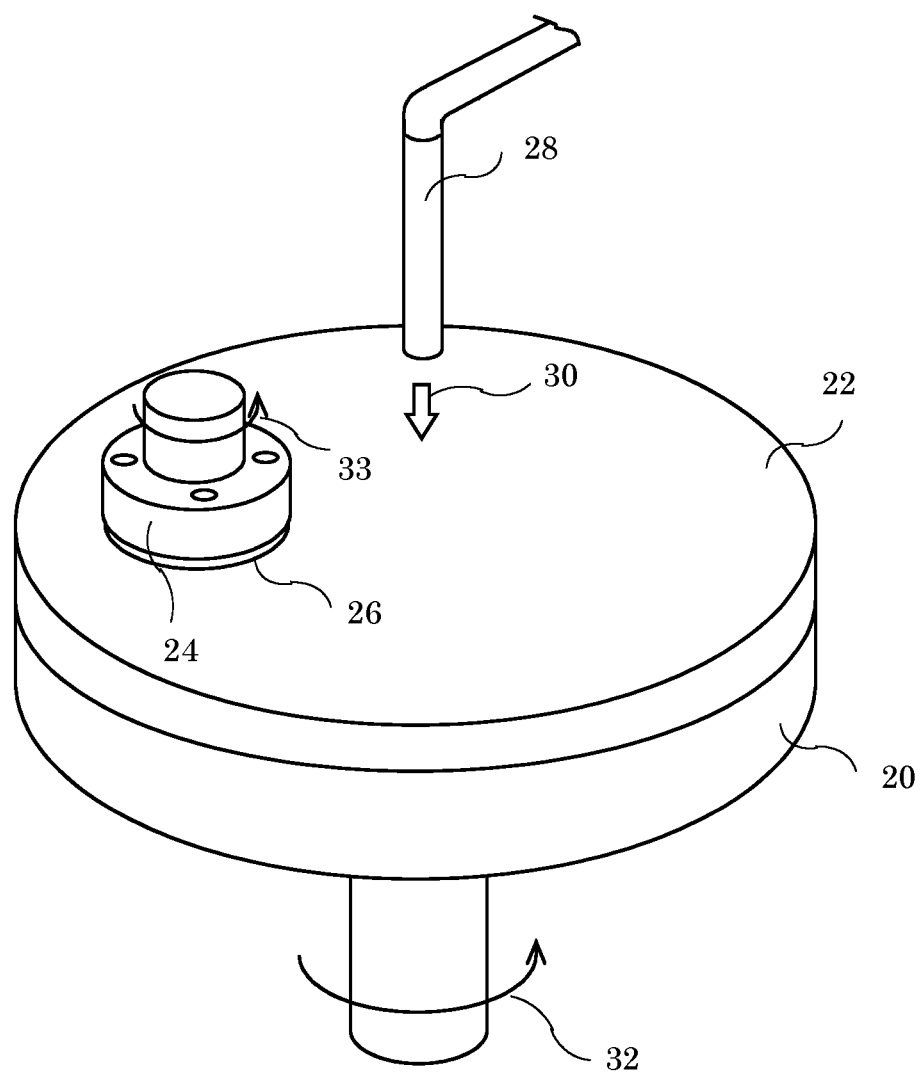
FIG. 2 is an approximately perspective view of a polishing device in which the abrasive particle of the present invention is used.

FIG. 2 is an approximately perspective view showing a polishing device in which the abrasive particle of the present invention is used.

A surface plate 20 is rotationally driven in the direction of arrow 32. The top surface of the surface plate 20 is covered with an abrasive pad 22. A holding device 24 holds the object material (silicon carbide substrate or gallium nitride substrate) by pressing the object material 26 against the abrasive pad 22. In the present invention, the abrasive particles are provided from a liquid pourer 28 with the slurry in the direction of arrow 30. The object material 26 pressed against the surface of the abrasive pad 22 comes into contact with the abrasive particles and is polished. During the polishing process, the abrasive particles and the slurry are continually provided by a prescribed quantity.

For example, the abrasive particles of the present invention can be utilized to polish sapphire substrate, or silicon carbide or gallium nitride substrate used for a power device. The modified Mohs' hardness of sapphire substrate is 9, and that of silicon carbide or gallium nitride is 13. In the polishing process, the object material is polished until its surface roughness reaches 0.010 μm or lower, for example. In the polishing process, suspension (slurry) is provided on the polishing surface. The slurry is produced by scattering the abrasive particles into pure water. Surface active agent or chelate agent may be added to the water in order to help the abrasive particle scattering in the water. As described later, the pH of the slurry is set to a value not less than 4 and not more than 11 at a temperature of 25° C. This means that the pH range of the slurry can be limited between weak acidity and weak alkaline.

Generally, a polishing process starts from a crude processing, where both surfaces of the substrate are polished to arrange the basic shape. Then, in a middle processing, scarring left in the crude process are decreased. Finally, in a finishing processing, the surfaces are polished until the surface flatness reaches atomic precision level. Conventionally, diamond particles are employed to polish the substrate of silicon carbide or gallium nitride in the crude processing, in order to attain a possible highest polishing rate. However, the diamond particles, which have Vickers hardness higher than that of silicon carbide or gallium nitride, make deep saw marks on the substrate. In order to repair the saw marks, the middle processing over a long period of time is required.

It is considered to use fine diamond particles to avoid leaving the saw marks. However, when the finer particles are used in the mechanical polishing, the polishing rate becomes lower. Furthermore, making the finer diamond particles increases the production cost. Accordingly, the way to improve the polishing speed while preventing damage on the object surface has not been established yet.

The present invention resolves the above problem. Since a sufficient level of polishing rate is secured by using the abrasive particles of the present invention, it is possible to conduct the crude processing and the middle processing at the same time. In the abrasive particles of the present invention, the component 3, whose rigidity level is equal to or lower than that of silicon carbide or gallium nitride substrate, is contained.

In the polishing process, the slurry, where the abrasive particles of the present invention are scattered in 100 ml of pure water with 15% by weight, is used. The pH of the slurry is not less than 4 and not more than 11 at a temperature of 25° C. It is found from experiments that even after the polishing process has been performed for four hours, the pH value of the liquid-waste stays around 8. Desirable pH of the liquid-waste is not less than 5 and not more than 9. When materials other than $LiCo_3$ and $Ca_3(PO_4)_2$ are employed as the reaction promotor 14, the pH of the liquid-waste falls into this range. When $LiCo_3$ or $Ca_3(PO_4)_2$ is employed as the reaction promoter 14, the pH value becomes 10 to 11. In any case of the above, the pH of the liquid-waste falls into the range between weak acidity and weak alkaline. Accordingly, it is prevented to badly affect the working environment and the liquid-waste treatment becomes easy.

Preferably, the abrasive particles are put into the slurry with 5% by weight for to 100% of pure water, and the apparent specific volume (in standing) of the abrasive particles are adjusted to equal to or more than 0.5 ml/g and equal to or less than 200 ml/g. If the apparent specific volume (in standing) is less than 0.5 ml/g, the components of the abrasive particles can be separated from each other. On the other hand, even when the apparent specific volume (in standing) is more than 200 ml/g, the polishing rate is not increased. Further, since the amount of the abrasive particles is too much, a lot of abrasive particles can settle down.

In the device shown in FIG. 2, when the object material 26 is pressed against the surface of the abrasive pad 22 with elasticity, friction heat can be easily generated between the abrasive particles scattered on the surface of the abrasive pad 22 and the object material 26. For this purpose, the holding device 24 is preferably made of elastic material such as a rubber plate and the like. The abrasive pad 22 is preferably formed from synthetic fiber, glass fiber, natural fiber, synthetic resin, natural resin and the like. Since the holding device 24 gives proper elastic force to the object material 26, friction heat is effectively generated. As the result, high polishing rate is achieved. The friction heat, which is generated between the abrasive particle and the object material 26, is preferably higher than the temperature at which the reaction promoter 14 brings the chemical reaction.

At the early time of startup of the polishing device, as friction heat has not enough accumulated there, the temperature at the surface of the object material 26 is also insufficient. This lowers the polishing rate of the polishing device. In this case, a device for adjusting the temperature of the slurry may be installed into the polishing device. The abrasive particle of the present invention can also be used in the dry polishing. For example, when the abrasive pad is employed as a base material, abrasive member can be produced by scattering and fixing the abrasive particles into resin or fiber at an appropriate density. When a plastic molding product is employed as the base material, in order to make abrasive member, abrasive member can be produced by solidifying, in a predetermined way, the abrasive particles and unsolid plastic which are mixed in advance. Further, a stripe of tape on which the abrasive particles are scattered and fixed can also be employed as the base material. Although the abrasive member is suitable for a dry polishing, it can also be employed in a wet polishing with providing pure water to the polishing surface during the polishing process.

<Comparison with Conventional Art>

FIG. 3 is an explanatory figure showing the conventional mechanochemical polishing method, which are cited here as a comparison with that of the present invention. In the abrasive particles shown in FIG. 3A, several kinds of abrasive agent are mixed. Abrasive agents A 16 and abrasive agents B 18 are mixed in the slurry and provided to the polishing device. The abrasive agent B 18 functions to promote the polishing action of the abrasive agent A 16. As shown in FIG. 3B, the abrasive agents A 16 and the abrasive agents B 18 are separated with each other in the slurry, since both abrasive agents are different in specific gravity.

FIG. 3C shows an example where slurry 17 is used to promote the abrasive action of the abrasive agents A 16. In this method, the above mentioned problem is solved, so it is widely employed recently. However, in this method, since strong alkali material or oxidizing agent is used in the slurry 17, the slurry 17 has high corrosive property. Therefore, the slurry 17 may deteriorate the working environment and increase the liquid-waste treatment cost.

FIG. 3D shows an example where the abrasive agents A 16 are fixed to the surface of a polymer material 19. With this type of abrasive particle, the particle size becomes larger than the average particle size suitable to the lapping process of hard brittle material. Additionally, as the specific gravity of the abrasive particle A 16 is too low, the abrasive agents A 16 and the polymer material 19 may run out from the polishing device. On the other hand, since the abrasive particle of the present invention has enough high specific gravity, it can stay long on the surface of the abrasive pad 22, which helps to improve the polishing rate.

[First Embodiment]

<Structure and Action of Abrasive Particle>

Figure 4A:
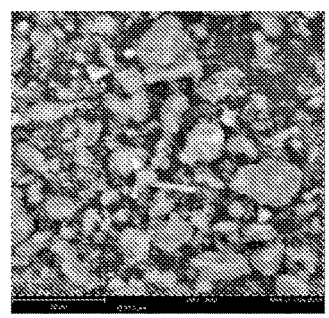
FIG. 4 is micrographs of abrasive particles of the present invention and explanatory figures of their action.
Figure 4B:
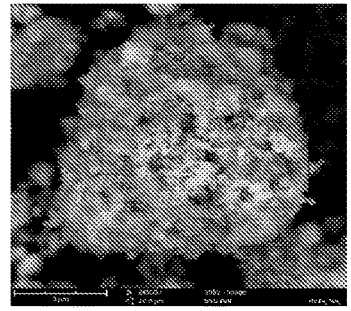

FIG. 4A and FIG. 4B are micrographs of the abrasive particle of the present invention, and FIGS. 4C-4F are explanatory figures of polishing action by the abrasive particle of the present invention.

FIG. 4A is a micrograph which illustrates the abrasive particles of a first embodiment immediately after integrated.

As shown in FIG. 4A, various sizes of abrasive particles exist. The average particle size is 5 to 6 μm. The particles having the size of about 1 μm are also included. FIG. 4B is a partial enlarged view of the abrasive particle having outer diameter of about 6 μm in FIG. 4A. Three kinds of components, where each of them is grinded in advance, are mixed and strongly integrated with each other. The components are integrated, while maintaining the inherent chemical and the physical properties respectively. In the abrasive particle of the present embodiment, the components are integrated not so as to be separated from each other even after the polishing process. Even after four hours of polishing of silicon carbide, the surface state of the abrasive particle is almost the same as the state shown in FIG. 4B.

The abrasive particle of the first embodiment is made by integrating aluminum oxide ($Al_2O_3$), manganese oxide ($MnO_2$), and calcium carbide ($CaCO_3$), with the following ratio; 50%, 37.5%, and 12.5% in weight. Specifically, aluminum oxide ($Al_2O_3$), manganese oxide ($MnO_2$), and calcium carbide ($CaCO_3$) are grinded through ball milling method until the particles become to have outer diameter of 1 μm or shorter; then the abrasive particles are given by continuously mechanically impacting aluminum oxide ($Al_2O_3$), manganese oxide ($MnO_2$), and calcium carbide ($CaCO_3$) for 0.5 hours. Thereafter, the abrasive particles having an average particle size of 1 μm are screened. The above-obtained abrasive particle and pure water are provided to the polishing device shown in FIG. 2, and then silicon carbide substrate is polished for four hours. During the polishing process, the slurry including the abrasive particles is continually provided on abrasive pad 22 and then successively discharged. The discharged slurry is collected for a repeated use and provided on the abrasive pad 22 again.

To produce the abrasive particle for polishing sapphire, aluminum oxide ($Al_2O_3$), silicon oxide ($SiO_2$), and calcium carbide ($CaCO_3$) are mixed and integrated at the following ratio; 50%, 37.5%, and 12.5% in weight through ball milling. Then, the abrasive particles having average particle size of 2 μm are screened. Even after the polishing process for sapphire substrate is performed for four hours, the abrasive particle can also be reusable.

For example, the way to join several kinds of inorganic compound using adhesive agent such as resin is known. However, when the joined inorganic compound is subject to the external forces occurred in polishing process, the binding power of the resin adhesive is not strong enough to prevent the joint from separating. Otherwise, a way to sinter the compounds to join with each other is considered. However, when sintered, each compound loses most of its inherent material properties. As the result, the polishing rate is not improved in contrast to the abrasive particle of the present invention. Further, the compounds are subject to a heat of about 1000° C. in the sintering process. Therefore, the compounds maybe altered or broken with the heat of sintering. On the other hands, in the mechanical alloying process of the present invention, the compounds are not subject to such a high heat.

Figure 4C:
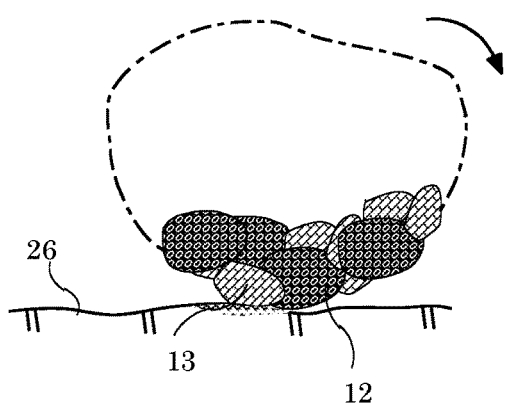
Figure 4D:
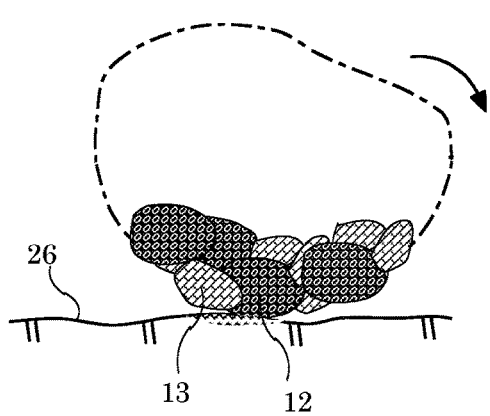

As shown in FIG. 4C, in the abrasive particle of the embodiment, each component is evenly mixed. Therefore, each component is partially exposed to the outer surface of the abrasive particle. The abrasive particle moves rolling and contacts the object material 26. When successively coming into contact with the object material, the abrasive particle itself generates frictional heat. The chemical abrasive agent in the abrasive particle is heated directly by the friction heat. This, in turn, induces the mechanochemical effect on the surface of the object material 26. Next, as shown in FIG. 4D, when the abrasive particle moves rolling on the object material 26, the component for mechanically polishing the object surface 26 promptly comes into contact with the part where mechanochemical effect is induced. Then that part of the object material 26 is removed.

When the abrasive particle moves rolling along the surface of the object material 26, the object surface alternately and repeatedly contacts with the chemically reactive component and the component for mechanically polishing the object surface. Before the friction heat diffuses into the slurry, these components and the object surface promptly contacts with each other. Thus, the polishing process proceeds successively and efficiently. Note that whole of the abrasive particle can be coated with any of the above components. In this case, the coated components are not exposed to the outer surface. However, once the coating breaks and the coated components are exposed, the same action as the above occurs. Further, all components may not be exposed to the outer surface, as long as the coating has a thickness which does not disturb the other components' action.

If the chemically reactive component and the mechanically polishing component are dispersed in the slurry, the mechanically polishing component is quite unlikely to come into contact with the part of the object surface on which mechanochemical effect is induced. This may delays the polishing process.

On the other hands, if the mechanochemical effect is induced evenly on the whole surface of the object material 26, any part of the surface can be mechanically polished. For this reason, the method for inducing the mechanochemical effect on the whole surface of the object material 26 by using the slurry produced from strong alkaline solution is employed as the most practical way for polishing. However, in this method, the liquid-waste treatment would cause a trouble, as explained before.

Figure 4E:
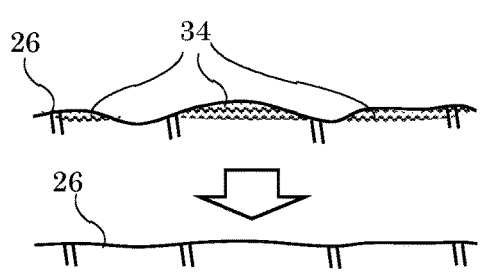
Figure 4F:
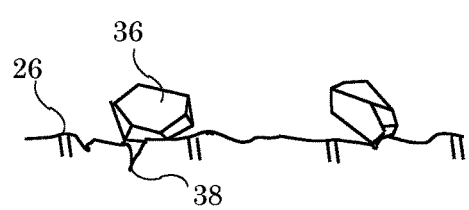

FIG. 4E is a sectional view of neighborhood of the surface of the object material 26 when the surface of the object material 26 is polished by the abrasive particle of the present embodiment. In this case, only the part (hatching part of FIG. 4E) of neighborhood of the surface of the object material 26 is removed. FIG. 4F is a sectional view of neighborhood of the surface of the object material 26 when the surface of the object material 26 is polished by diamond particles 36. In this case, deeply rooted saw 38 is made on the surface of the object material 26. This is the most problematic thing in the conventional methods.

<Analysis of Abrasive Particle after Polishing Process>

FIG. 5A is a table showing a comparison of components ratio of the abrasive particle before/after polishing silicon carbide substrate for four hours.

The upper section of the table of FIG. 5A shows a ratio of each component in the abrasive particle before performing the polishing process and the lower section shows a ratio of each component in the abrasive particle after performing the polishing process. Before and after the polishing process, there is not any significant change in the ratio of the components. Judging from this result and the external shape of the components, it is found that most of the combined components extracted from the slurry after the four hours of polishing maintain the original shape. This means that since the abrasive particle of the present invention has high mechanical strength and not be broken in a polishing process, so it can be used repeatedly. Note that it is also found that about 3% of the total weight of the abrasive particle is consumed in the chemical reaction.

FIG. 5B is a table showing a comparison of components ratio of the abrasive particle before/after polishing sapphire substrate for four hours.

The ratio of each component to the whole abrasive particle is found to be: aluminum (Al) 38.2% by weight, silicon (Si) 43.8% by weight, and calcium (Ca) 17.9% byweight, before the polishing process. After the polishing process, this becomes as follows; 41.2% by weight, 42.3% by weight, and 16.5% by weight, respectively. While the ratio of aluminum increases, those of the other two components are almost unchanged throughout the polishing process. The reason for the increase of aluminum is considered that aluminum is separated from sapphire in the polishing process.

When the components of residue, which is discharged with slurry after the polishing process, is analyzed, the ratio of each component to the whole residue is found to be: aluminum (Al) 52% by weight, silicon (Si) 33% by weight, and calcium (Ca) 0.5% by weight, and further mullite is found to be contained there.

It is studied whether mullite is yield due to mechanical resolution or heat resolution of the abrasive particle or otherwise due to the other factors. The amount of mullite is proportional to the time length of the polishing process, and it also considerably exceeds the amount of the abrasive particle consumed during the polishing process. This means that the mullite is a residue of the object material 26 produced when the abrasive particles polish the object material 26 while chemically altering the surface of the object material 26. In any of the conventional wet polishing methods, this amount of mullite is not produced after four hours of polishing process. Therefore, it is proven that reaction promoter 14 has acted properly during the polishing process.

Mullite, which is a compound of aluminum oxide and silicon dioxide, is expressed by the following chemical formula: $3Al_2O_3 \cdot 2SiO_2$ to $2Al_2O_3 \cdot SiO_2$, or $Al_6O_{13}Si_2$. Therefore, it is considered that calcium carbonate prompts the reaction between object material 26 and aluminum oxide, where mullite is yielded consequently. When the abrasive particle of the present invention and the object material 26 are rubbed against each other, the friction heat is generated. The heat becomes hundreds of centigrade partially. Although the friction heat is diffused into slurry, it makes some minute area of high temperature.

FIG. 6 shows a comparison of properties of liquid-waste drained after the polishing process with various abrasive particles.

As shown in FIG. 6A, it is found that the temperature of the slurry drained after the polishing process rises up to 30 to 40° C. from room temperature. Therefore, it is confirmed that reaction promoter works to give some effect in the slurry. The liquid-waste of slurry consists of water and residues which are shavings of the silicon carbide substrate or the gallium nitride substrate. Since the residues are solid elements, they can be removed from the liquid-waste by using a filter. In most samples, the pH range of the liquid-waste stays around 7.5, and even the highest pH is 11.2, although the pH of the liquid-waste depends on the kind of the reaction promoter 14 to some extent. Thus, since the liquid-waste is pH neutral, the treatment of the liquid-waste is easy and harmless.

When the abrasive particle in which $Al_2O_3$, $SiO_2$ and $CaCO_3$ are integrated is used for polishing sapphire, high polishing rate (0.7 to 1.0 µm per minute) is attained. As shown in FIG. 6B, when materials other than $LiCo_3$ and $Ca_2(PO_4)_2$ are employed as the reaction promoter 14, the pH value of the slurry falls into the range of 4.63 to 8.0 before the polishing process and into the range of 4.2 to 8.2 after the polishing process. When either $LiCO_3$ or $Ca_3(PO_4)_2$ is employed as the reaction promoter 14, pH value of each slurry is 10.1 and 9.0 respectively before the polishing process and 11.2 and 9.6 respectively after the polishing process. It is found that since only limited minimum area becomes high alkali atmosphere at high temperature, it scarcely affects pH of the slurry. Thus, in any of the above cases, since pH of the slurry stays in the range between weak acidity and weak alkaline, bad effects to working environment can be avoided, and the liquid-waste treatment becomes easy.

[Embodiment 2]

<Prove of Action of First Component>

FIG. 7 shows a comparison of the polishing rate when various materials are employed as the first component for polishing SiC.

Sample 1-1 shows, for example, the result when silicon carbide is polished with the abrasive particle in which $Al_3O_3$, $MnO_2$ and $CaCO_3$ are integrated.

In this embodiment, the operation condition of the polishing device is set as follows; revolution speed of the surface plate 20 is 5 rpm, revolution speed of holding device 24 is 100 rpm; polishing pressure at which the holding device 24 presses the object material 26 against the surface plate 20 is 160 g/cm². The slurry produced by scattering of the abrasive particle 15% by weight into pure water is provided on the abrasive pad 22 from the liquid pourer 28 at the rate of 10 ml/min.

Sample 2-1 shows the result when silicon carbide is polished with the abrasive particle in which $ZrO_2$, $MnO_2$ and $CaCO_3$ are integrated. In each sample, various materials are employed as the first component 12 respectively as below; $ZrSiO_4$ in sample 2-2, mica in sample 2-3, talc in sample 2-4. The first component does not induce the mechano-chemical effect. The modified Mohs' hardness of $ZrO_2$ (first component) is 11, while that of silicon carbide is 13. Accordingly first component alone cannot polish silicon carbide.

As shown in the figure, the abrasive particle in which $ZrO_2$ (first component), $MnO_2$ (second component) and $CaCO_3$ (reaction promoter) are integrated has the highest polishing rate. Specifically, while the polishing rate (comparison 6) of the diamond particle is 0.26 (μm/min) as shown in FIG. 8, the polishing rate of the abrasive particle in sample 1-1 is 0.72 (μm/min) i.e., 2.8 times higher than that of the diamond particle. The action of the first component 12 in polishing gallium nitride is almost same as the above. Therefore, the illustration is omitted here.

<Prove of Action of Second Component>

FIG. 8 shows a comparison of polishing rate when various materials are employed as the second component 13 for polishing SiC. In FIG. 8, the second component 13 is selected one by one from among various component samples with a predetermined first component 12 ($Al_2O_3$) and a predetermined reaction promoter 14 ($CaCO_3$). Sample 1-1 shows, for example, the result when silicon carbide is polished with the abrasive particle in which $Al_2O_3$, $MnO_2$ and $CaCO_3$ are integrated. Employed material as the second component 13 is as follows; $TiO_2$ in sample 3-1, ZnO in sample 3-2, NiO in sample 3-3, $SnO_2$ in sample 3-4, $Sb_2O_3$ in sample 3-5, CuO in sample 3-6, $Co_3O_4$ in sample 3-7, $CeO_2$ in sample 3-8, $Pr_6O_{11}$ in sample 3-9, and Ti—Cr—Sb, which is multiple oxide material, in sample 3-10.

Samples 3-11 and 3-12 show the abrasive particles having a double component structure. In sample 3-11, aluminum oxide ($Al_2O_3$) and manganese dioxide ($MnO_2$) are mechanically combined and integrated in the same way as the present invention. In sample 3-12, calcium carbonate ($CaCO_3$) and manganese dioxide ($MnO_2$) are mechanically combined and integrated in the same way as the present invention. In both samples, although only two kinds of components are used, the polishing rate is the same level as which attained by using the diamond particle.

In comparative example 1, aluminum oxide ($Al_2O_3$) and calcium carbonate ($CaCO_3$) are mechanically combined and integrated in the same way as the present invention. In comparative example 2, aluminum oxide ($Al_2O_3$), manganese dioxide ($MnO_2$) and calcium carbonate ($CaCO_3$) which are not integrated each other are scattered into pure water. In comparative example 3, manganese dioxide ($MnO_2$) alone is employed as the abrasive particle. In comparative example 4, aluminum oxide ($Al_2O_3$) alone is employed as the abrasive particle. In comparative example 5, calcium carbonate ($CaCO_3$) alone is employed as the abrasive particle.

In all of the above examples, resin pad is employed in the polishing device, and pure water containing the abrasive particles is used for the slurry. On the other hand, in comparative example 6, a metal plate is employed in the polishing device, and oil containing the diamond particles having average particle size of 1 to 3 μm is used for the slurry.

Here, the polishing rates of all the above examples are compared. The polishing rate in any of comparative examples 1 to 5 is almost 0 μm per minute, while the polishing rate is 0.72 μm per minute in sample 1. Even when the diamond particle is employed, the polishing rate is low (0.26 μm per minute as shown in comparative example 6). Moreover, there is the problem of saw marks when the diamond particle is used.

In Sample 1-1 of FIG. 8, an extremely high polishing rate is obtained in polishing SiC. In samples 3-11 and 3-12, the polishing rates are sufficiently high for a practical use, compared to the conventional methods. In some of the other samples, although the polishing rate is equal to or lower than that of the diamond particle, harmful liquid-waste is not drained and the surface is polished at excellent quality. Since the components integrated each other are unlikely to dissolve into the slurry, the slurry is not contaminated so much. Considering these advantages, the methods of these samples are superior to the conventional methods.

Since all of the above samples employ pure water as the scattering medium for the slurry, the working environment is not deteriorated. The surface of the steel plate used for the polishing process has to be made as flat as that of the object materials 26 such as silicon carbide or gallium nitride. However, it is not such an easy thing. On the other hand, in the present invention, the surface of the object material 26 is polished by the abrasive particle pressed against the surface of the object material 26 by the resin pad. Therefore, a precision structure is not required for the polishing device. Additionally, the resin pad is low-priced and easily maintainable.

<Case of Polishing Gallium Nitride>

FIG. 9 shows a comparison of the polishing rates when various materials are employed as the second component for polishing gallium nitride.

Combinations of the components used in the abrasive particle in Sample 1-1, 3-1 to 3-11 are the same as that of samples having the same sample number in FIG. 8. In Sample 1-1, an extremely high polishing rate is obtained in polishing gallium nitride. In Samples 3-9 and 3-10, high polishing rates are obtained. In Samples 3-2, 3-3, 3-4, and 3-6, sufficiently high polishing rates are obtained, compared to comparative example 8 of FIG. 8. While low polishing rates are obtained in the other samples, the liquid-waste is not harmful and the quality of the surface of the object material 26 is extremely high, likewise in the case of FIG. 8. Even when talc or mica, whose modified Mohs' hardness is low, is employed as the first component, the same or higher level of the polishing rate than that of diamond particle is achieved. Further, sufficiently high quality of polishing the surface of the object material 26 can be obtained.

<Case of Polishing Sapphire>

FIG. 9B shows a comparison of the polishing rates when various materials are employed as the second component for polishing sapphire.

Sample 1 indicates the result when sapphire is polished with the abrasive particle in which $Al_2O_3$, $SiO_2$ and $CaCO_3$ are integrated. Sample 2 indicates the result when sapphire is polished with the abrasive particle in which $Al_2O_3$, $Fe_2O_3$ and $CaCO_3$ are integrated. Sample 3 indicates the result when sapphire is polished with the abrasive particle in which $Al_2O_3$, $Cr_2O_3$ and $CaCO_3$ are integrated.

In this example, sapphire wafer having the surface roughness Ra 0.22 µm, which is polished with GC (green carbonate) having the average particle size #325, is employed. Operation condition of the polishing device 24 is set as follows; rotating speed of the abrasive plate 20 is 50 rpm, rotating speed of the holding device 24 is 100 rpm; polishing pressure at which the holding device 24 presses the object material 26 against the abrasive plate 20 is 160 g/cm$^2$; where 15% by weight of the abrasive particle is contained into pure water. The obtained slurry is provided on the abrasive pad 22 from the liquid pourer 28 at the rate of 1 ml/min.

In "ref 1", aluminum oxide ($Al_2O_3$) alone is employed as the abrasive particle. In "ref 2", silicon oxide ($SiO_2$) alone is employed as the abrasive particle. In "ref 3", calcium carbonate ($CaCO_3$) alone is employed as the abrasive particle.

In "ref 4", aluminum oxide ($Al_2O_3$) and silicon oxide ($SiO_2$), which are mechanically combined and integrated in the same way as the present invention, are employed as the abrasive particle. In "ref 5", aluminum oxide ($Al_2O_3$) and calcium carbonate ($CaCO_3$), which are mechanically combined and integrated in the same way as the present invention, are employed as the abrasive particle.

In "ref 6", silicon oxide ($SiO_2$) and calcium carbonate ($CaCO_3$), which are mechanically combined and integrated in the same way as the present invention, are employed as the abrasive particle. In "ref 7", the mixture of compound of aluminum oxide (Al2O3), silicon oxide ($SiO_2$) and calcium carbonate ($CaCO_3$), which are not integrated each other, are employed as the abrasive particle. In "ref 8", the diamond particle having average particle size of 1 to 3 µm is employed as the abrasive particle. In any of the above examples, a resin pad is employed as the abrasive pad 22 and the slurry is produced by scattering the abrasive particles into pure water. On the other hand, in "ref 9", the diamond particle having the average particle size of 1 to 3 µm, a steel plate, and oil slurry are employed.

Polishing rates of all the above examples are compared in here. While 1.0 µm per minute of the polishing rate is obtained in sample 1, the polishing rate cannot exceed 0.3 µm in any of comparative "ref 1" to "ref 8". Although "ref 9" is known to have the highest polishing rate among conventional ways, its polishing rate is 0.8 µm per minute, which is below that of the present invention.

In samples 1 and 2, higher polishing rate than that of any other conventional ways is achieved. In sample 3, the same level of the polishing rate as "ref 9" is achieved. In any of samples 1 to 3, the working environment is not deteriorated since pure water is employed as the scattering medium, which makes it is easy to handle the liquid-waste. If a steel plate is used for the polishing process, the surface of the steel plate has to be made as flat as that of the object material 26 of sapphire. However, it is not such an easy thing. On the other hand, in the present invention, the surface of the object material 26 is polished by the abrasive particle pressed against the surface of the object material 26 by the resin pad. Therefore, a precision structure is not required for the polishing device. Additionally, the resin pad is low-priced and easily maintainable. This is advantageous to the conventional way using the steel plate.

<Prove of Action of Reaction Promoter>

FIG. 10 shows the relationships between the polishing rate for polishing SiC and the temperature of the slurry after the polishing process with using various reaction promoters 14.

In comparative example 1, the abrasive particle which does not include the reaction promoter 14 is employed. Samples 11 to 18 show the result when the polishing of silicon carbide is performed for four hours with the abrasive particle of $Al_3O_3$ (the first component 12) and $MnO_2$ (the second component 13), where the reaction promoter 14 is selected one by one from among various component samples.

In sample 19, the abrasive particle containing only $CaCO_3$ (reaction promoter 14) and $MnO_2$ (second component 13), where the components are integrated each other, is employed. In sample 20, the abrasive particle containing only $CaCO_3$ (reaction promoter 14) and $Al_2O_3$ (first component 12), where the components are integrated each other, is employed.

FIG. 10A indicates that, in all samples except comparative example 1, the temperature of the slurry after the polishing process is more than 30° C. This means the temperature of the slurry is raised by the heat generated by the reaction promoter 14. The higher the temperature of the slurry, the higher the polishing rate becomes. In other words, the higher the temperature of the slurry, the more actively the reaction promoter 14 reacts.

In comparative example 1, the polishing rate is 0.31 µm/min and the temperature of the slurry after the polishing process is 27° C. When the result of comparative example 1 is compared to the others, it is found that the heat generated in the chemical reaction of the reaction promoter 14 raises the temperature of the slurry as well as the friction heat. Additionally, it is proven that, as shown in samples 11 to 18, the integrated abrasive particle of the first component 12, the second component 13, and the reaction promoter 14 increases the polishing rate drastically. As to the polishing of gallium nitride, since the action of reaction promoter 14 is the same as the above, the illustration is omitted.

In FIG. 10B, the relationship between the polishing rate and the temperature of the slurry after the polishing process is illustrated. In experimental examples 1 to 8, with the integrated abrasive particle of $Al_2O_3$ (first abrasive agent) and $SiO_2$ (second abrasive agent), where the reaction promoter 14 is selected one by one from among various component samples. Any of the abrasive particles of the examples has the following component ratio; 50% by weight of the first abrasive agent; 37.5% by weight of the second abrasive agent, and 12.5% by weight of the reaction promoter. Sapphire wafer having the surface roughness Ra 0.22

µm, which is polished with GC (green carbonate) having the average particle size #325, is employed as the object material 26. The temperature of the slurry before the polishing process is 25° C. Under the above polishing conditions, the temperature of the slurry after polishing the sapphire substrate for an hour is measured. The polishing rate is a polishing amount per minute. The polishing rate is obtained by measuring the thickness of the object material 26 after the polishing process.

In "ref 1", the reaction promoter 14 is not contained in the abrasive particle. In "ref 2", only the reaction promoter 14 ($CaCO_3$) and the second abrasive agent ($SiO_2$) are contained in the abrasive particle. In "ref 3", only the reaction promoter 14 ($CaCO_3$) and the first abrasive agent ($Al_2O_3$) are contained in the abrasive particle.

In any of examples 1 to 8, it is indicated that the temperature of the slurry after the polishing process is equal to or more than 30° C. This means the temperature of the slurry is raised by not only the friction heat generated between the object material 26 and the abrasive particles but also the heat generated by the reaction promoter 14. The higher the temperature of the slurry, the higher the polishing rate is. In other words, the higher the temperature of the slurry, the more actively the reaction promoter 14 reacts.

In "ref 1", the polishing rate is 0.40 µm/min and the temperature of the slurry after the polishing process is 27° C. In "ref 2" (it does not include the first component 12) and "ref 3" (it does not include the second component 13), it is found that the heat generated in the chemical reaction of reaction promoter raises the temperature of the slurry up to 41° C. However, in both samples, the polishing rate is not high enough. Therefore, it is proven that only the abrasive particle of the present invention in which the first abrasive agent, the second abrasive agent, and the reaction promoter 14 are integrated with each other can increase the polishing rate sufficiently.

<Reason for Increase of Polishing Rate>

Here, the reasons why the abrasive particle of the present invention can improve the polishing rate drastically will be described in sequence.

(1) Reason why the first component 12, whose modified Mohs' hardness is 13 or lower, is included in the abrasive particle.

Each of $ZrSiO_4$, $Al_2O_3$, $ZrO_2$, and SiC has a modified Mohs' hardness equal to or less than 13. These components help to form the plastic deformation layer (amorphous layer) by applying physical force to silicon carbide or gallium nitride. After the plastic deformation layer is altered by the machnochemical effect induced by the second component, the first component mechanically removes the altered plastic deformation layer. When the plastic deformation layer is formed on the object material 26, the crystalline structure of the part is destroyed. Therefore, the mechanochemical effect is likely to be induced by the second component. When the plastic deformation layer is altered, it becomes easy to remove the altered plastic deformation layer with the first component whose hardness is lower than that of the object material 26. This action is also applied when sapphire is employed as the object material 26.

The modified Mohs' hardness of $Al_2O_3$ is 9, while that of $ZrSiO_4$ and $ZrO_2$ is 8. Since the modified Mohs' hardness of any of these abrasive particles is lower than that of silicon carbide or gallium nitride, it can be restrained that these abrasive particles leave saw marks on the surface of the object material 26. Since $Al_2O_3$ is harder than $ZrSiO_4$, the abrasive particle including $Al_2O_3$ have higher polishing rate than the abrasive particle including $ZrSiO_4$.

(2) Reason why the second component 13, which induces the mechanochemical effect, is included in the abrasive particle.

$Cr_2O_3$, $Fe_2O_3$, $TiO_2$, ZnO, NiO, $SnO_2$, $Sb_2O_3$, CuO, $Co_3O_4$, $CeO_2$, $Pr_6O_{11}$, and $MnO_2$ are components which induce the mechanochemical effect. Any of them is likely to yield the oxidation reaction with silicon carbide or gallium nitride under high temperature atmosphere. They are also likely to yield the solid phase reaction. It is considered that, by these chemical reactions, the surface of the object material 26 such as silicon carbide or gallium nitride is altered, as mentioned in the prior art documents.

$Cr_2O_3$, $FeO_3$ or $SiO_2$ is employed as the mechanochemical abrasive agent for sapphire. These abrasive agents are likely to operate the isomorphous substitution with sapphire ($Al_2O_3$). In the isomorphous substitution, ion clusters having approximate ionic radius are replaced with each other, when pressure or heat are provided from external.

$Fe_3^+$ (ionic radius of 0.55 Å (angstrom)) of $Fe_2O_3$ having six-coordination construction or $Cr_3^+$ (ionic radius of 0.62 Å) of $Cr_2O_3$ having six-coordination construction has ionic radius closed to $Al_3^+$ (ionic radius of 0.54 Å) of sapphire having six-coordination construction. Therefore, the isomorphous substitution occurs between these ion clusters. Due to this chemical reaction, it is considered that the polishing surface of sapphire is altered.

On the other hands, the chemical reaction of $SiO_2$ is explained as below; when $SiO_4$ having tetrahedron construction and including silanol group (Si—OH) is connected with each other in a dehydration condensation reaction, $Al_{3+}$ ($Al(OH)_3$) participates the reaction. Then, $SiO_4$ is put into the crystalline structure of sapphire; where, inside the connected body of $SiO_4$, six-coordination Si4+ (ionic radius of 0.40 Å) is replaced with four-coordination $Al3^+$ (ionic radius of 0.39 Å). This chemical reaction of isomorphous substitution is considered to deform the polishing surface of sapphire.

(3) Reason why the reaction promoter 14 is included in the abrasive particle.

The chemical reaction occurring when calcium carbonate ($CaCO_3$) is employed as the reaction promoter 14 is explained here. Calcium carbonate is broken into CaO and $CO_2$, due to the friction heat generated between the abrasive particle and the surface of silicon carbide or gallium nitride when both materials are rubbed with each other. Further, when the friction heat rises up to several hundred centigrade, calcium oxide (CaO) reacts to water while generating heat. As the result, calcium hydroxide ($Ca(OH)_2$) is generated. This reaction occurs in a very limited minimum area, where silicon carbide or gallium nitride and the abrasive particle are come into contact with each other. This reaction alters the surface of silicon carbide or gallium nitride, and simultaneously the chemical reaction such as the mechanochemical effect is accelerated on the object material, at high temperature of strong alkaline atmosphere.

As explained above, the abrasive particle forms the plastic deformation layer on the object surface of silicon carbide or gallium nitride and the reaction promoter 14 forms strong alkaline atmosphere on the plastic deformation layer to promote the mechanochemical effect. Due to the friction heat generated there, the temperature of the slurry after the polishing becomes 30 to 40° C. The strong alkaline atmosphere is formed on very limited areas around the abrasive particle. Therefore, the strong alkaline atmosphere hardly affects the pH value of the whole slurry.

The same reaction is observed when $SrCO_3$, $MgCO_3$, $BaCO_3$ etc. are employed. The above reaction occurs quite partially. The pH value of the slurry after the polishing process slightly rises from the neutral pH of 7. Even when the surface of silicon carbide or gallium nitride is altered by the second component 13, the polishing rate will not increase if the first component 12 does not contact the altered portion precisely. Accordingly, when the abrasive particle and the reaction promoter 14 exist separately in the slurry as in conventional ways, sufficiently high polishing rate cannot be attained. On the other hand, in the abrasive particle of the present invention, since the first component 12, the second component 13 and the reaction promoter 14 are combined and integrated each other, it is possible to obtain the above mentioned results. In the present invention, it becomes possible to polish silicon carbide or gallium nitride through the wet polishing method at sufficiently high polishing rate. As the result, it becomes possible to obtain a high quality of polishing surface.

FIG. 11 shows the relationships between the polishing pressure and the polishing rate of samples 1 to 3. This is to confirm a change in polishing rate when different strength of polishing pressure is applied. The experimental result is based on three different arrangements of polishing pressure, at which the holding device 24 presses the object material 26 against the abrasive plate 20. The three arrangements of polishing pressure to be applied to each sample are as follows; 500 g/cm$^2$, 750 g/cm$^2$, and 1000 g/cm$^2$. The other experimental conditions are as follows; rotating speed of the abrasive plate 20 of is 50 rpm, rotating speed of the carrier is 100 rpm; 15% by weight of the abrasive particle is contained in the slurry; the slurry is supplied to the device 10 ml/min.

According to the result, when the polishing pressure is increased, the polishing rate of SiC substrate is also improved. In the case of sample 1, for example, when the polishing pressure is set at 500 g/cm$^2$, the polishing rate becomes 0.72 μm/min. Whereas, when the polishing pressure is set at 1000 g/cm$^2$, the polishing rate becomes 1.39 μm/min, i.e. which is improved by two times. Further, even when the polishing pressure is set at 1000 g/cm$^2$ to polish silicon carbide substrate, 0.003 μm of surface roughness is obtained, without leaving any saw mark.

It is proven from this example that, by increasing the polishing pressure, more friction heat is generated and then the abrasive particle polishes the surface of the object material 26 more efficiently. Any abrasive particles of samples 1 to 3 can polish the surface of the object material 26 with high quality, at higher speed than any other conventional ones.

FIG. 12 shows the relationships between the polishing rates of various combined particles and the surface roughness. In this example, the polishing rate and the surface roughness of the object material 26 for each of various combined particle are indicated, where pure water based slurry is used. To make a comparison, the relationships between the polishing rate and the surface roughness when each of $SiO_2$, $MnO_2$, $CeO_2$, and $TiO_2$ and also diamond alone are employed as the abrasive particle are included. In polishing SiC, the polishing rate of materials other than diamond is quite low, which is not for a practical use. In the present invention, even when the pure water based slurry is used, any sample shows polishing rate higher than that of the diamond particle. Further, the surface roughness of SiC substrate after the polishing process is significantly low. In other words, high quality of polishing surface is obtained.

FIG. 13 shows the relationships between the polishing rate and the surface roughness of various combined particles. In this example, SiC substrate is polished with the abrasive particle of $SiO_2$, $MnO_2$, $CeO_2$, or $TiO_2$, where oxidizing agent $H_2O_2$ is included in the slurry. Compared to the result of FIG. 12, the polishing rates are improved slightly. Yet, these polishing rate are still low and not for a practical use.

Figure 14:
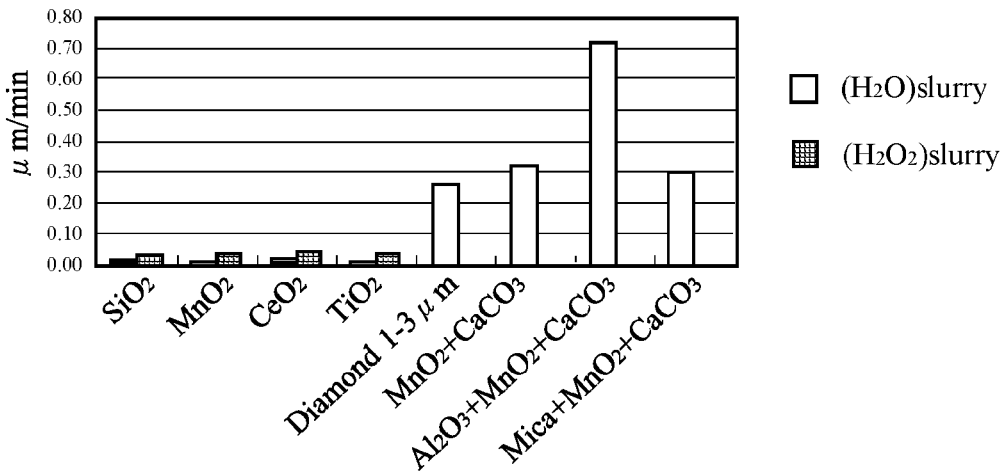
FIG. 14 is a comparative diagram of polishing rates.
Figure 15:
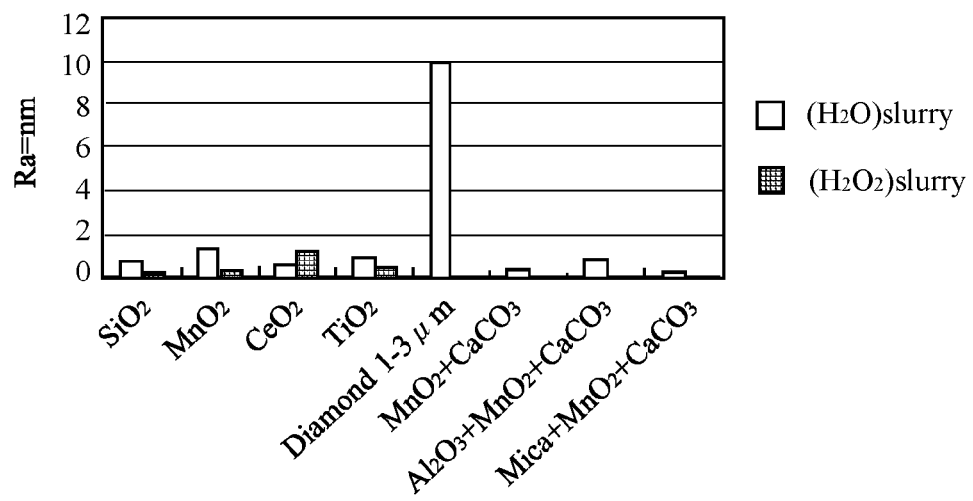
FIG. 15 is a comparative diagram of surface roughness after the polishing process.

FIG. 14 is a comparative diagram of the polishing rates and FIG. 15 is a comparative diagram of the surface roughness after the polishing process, the experimental results of FIGS. 12 and 13 being reflected on FIGS. 14 and 15, respectively. As indicated in FIG. 14, the abrasive particle of the present invention has the same or higher level of the polishing rate, compared to that of the diamond particle. As indicated in FIG. 15, the surface roughness made with the abrasive particle of the present invention has much higher quality than that made with the diamond particle.

As explained before, the area where the reaction promoter 14 generates the friction heat and the area where manganese dioxide exerts oxidation effect are extremely small. Further, the duration when these effects have been occurring is quite short. If the reaction promoter 14, oxidizing agent, and the mechanical abrasive agent are dispersed in the slurry and alternately come into contact with the surface of the object material 26 at irregular long interval, mutual action of these components cannot be achieved. However, in the present invention, immediately after the oxidation effect of the second component 13 is accelerated due to the friction heat, the first component 12 comes into contact with that oxidized area. With this mutual action, the efficient polishing can be conducted. This is why the present invention employs combined and integrated abrasive particle. Moreover, this is the revolutionary way of the present invention by which such a high polishing rate is achieved.

Through the present invention, high flatness level of polishing surface is achieved, while the middle process for polishing the surface of the object material 26 is shortened. This, in turn, helps to reduce the finishing process drastically. Accordingly, it becomes possible to significantly decline the cost in the polishing process, which occupies major part of the total production cost of this type of substrate. Additionally, in stead of strong acid solution or strong alkaline solution, water based pH neutral slurry is employed as the scattering medium of the abrasive particle, so the liquid-waste becomes weak acid or weak alkaline, which does not affect the environment badly.

In the above example of the present invention, sapphire, silicon carbide, or gallium nitride is employed as the object material 26. However, the object material 26 is not limited to these materials and other materials can also be polished greatly, at a high speed. Also, in the abrasive particle of the embodiment, two or three kinds of inorganic components are integrated. However, even if four or more kinds of inorganic components may be integrated each other through the amorphous layer, similar functions can be obtained. The ratio and combination of the compounds can be selected freely, depending on the material of the object material 26.

In the embodiment, only one kind of the first component 12 and only one kind of the second component 13 are selected, or only one kind of the first component 12, only one kind of the second component 13 and only one kind of the third component 14 are selected. However, for example, one kind of the first component 12 can be combined with two kinds of the second components 12. In short, various kinds of each component can be combined together.

The abrasive particle of the present invention can be widely employed to polish sapphire, silicon carbide, or gallium nitride, which is used in the substrates for the power device, the electronic device material, the electrical insulation material, and the like. The abrasive particle of the present invention can be widely employed for polishing those materials with a high quality; metal, ceramic, biomaterial such as artificial bone, and further hard material such as tungsten. There, the polishing process is significantly shortened and the production cost can be reduced drastically, when it is compared to the case employing the conventional polishing methods.

10 Abrasive particle (third component)
11 Abrasive particle (second component)
12 First component
13 Second component
14 Reaction promoter
15 Amorphous layer
16 A abrasive agent
18 B abrasive agent
17 Slurry
19 Polymer material
20 Surface plate
22 Abrasive pad
24 Holding device
26 Object material
28 Liquid pourer
30 Arrow
32 Arrow
33 Arrow

What is claimed is:

1. An abrasive particle for polishing a surface of an object material comprising:
a first polishing component which is an inorganic compound having a Mohs' hardness equal to or lower than the object material; and
a second polishing component for chemically altering the object material,
wherein the first polishing component and the second polishing component are integrated to a particle having a size not less than 0.05 µm and not more than 100 µm, using a mechanical alloying process,
wherein the first polishing component has a weight not less than 5% and not more than 95% for the weight of the integrated particle,
wherein the second polishing component has a weight not less than 5% and not more than 95% for the weight of the integrated particle,
wherein each of the first polishing component and the second polishing component is partially exposed to an outer surface of the integrated particle,
wherein one or more of talc, $ZrSiO_4$, $ZrO_2$, $Al_2O_3$, or SiC is employed as a mechanical polishing component of the first polishing component, and
wherein the second polishing component comprises one or more insoluble salt selected from the group consisting of lithium carbonate, alkali carbonate, phosphate, fluorine compound, boron compound, halogen compound, and an alum.

2. An abrasive particle for polishing a surface of an object material comprising:
a first polishing component which is an inorganic compound having a Mohs' hardness equal to or lower than the object material; and
a second polishing component for chemically altering the object material
wherein the first polishing component and the second polishing component are integrated to a particle having a size not less than 0.05 µm and not more than 100 µm through an amorphous layer, while maintaining inherent material properties respectively,
wherein the first polishing component has a weight not less than 5% and not more than 95% for the weight of the integrated particle,
wherein the second polishing component has a weight not less than 5% and not more than 95% for the weight of the integrated particle,
wherein each of the first polishing component and the second polishing component is partially exposed to an outer surface of the integrated particle,
wherein one or more of talc, $ZrSiO_4$, $ZrO_2$, $Al_2O_3$, or SiC is employed as avc mechanical polishing component of the first polising component, and
wherein the second polishing component comprises one or more insoluble salt selected from the group consisting of lithium carbonate, alkali carbonate, phosphate, fluorine compound, boron compound, halogen compound, and an alum.

3. The abrasive particle according to claim 1,
wherein the second polishing component includes a chemical polishing component for inducing a mechanochemical effect on the object material, and
wherein the second polishing component comprises one or more of $SiO_2$, $Fe_2O_3$, $Cr_2O_3$, and $CeO_2$.

4. The abrasive particle according to claim 2,
wherein the second polishing component includes a chemical polishing component for inducing a mechanochemical effect on the object material, and
wherein the second polishing component comprises one or more of $SiO_2$, $Fe_2O_3$, $Cr_2O_3$, and $CeO_2$.

5. The abrasive particle according to claim 1, wherein the second polishing component includes an oxidizing agent for inducing the mechanochemical effect on the object material by oxidizing the surface of the object material in response to a friction heat generated during a polishing process.

6. The abrasive particle according to claim 2, wherein the second polishing component includes an oxidizing agent for inducing the mechanochemical effect on the object material by oxidizing the surface of the object material in response to a friction heat generated during a polishing process.

7. The abrasive particle according to claim 5, wherein $MnO_2$ is employed as the oxidizing agent.

8. The abrasive particle according to claim 6, wherein $MnO_2$ is employed as the oxidizing agent.

9. An abrasive particle for polishing sapphire as the object material in a wet polishing comprising:
a first polishing component which is an inorganic compound having a Mohs' hardness equal to or lower than the object material; and
a second polishing component for chemically altering the object material,
wherein the first polishing component and the second polishing component are integrated to a particle having a size not less than 0.05 µm and not more than 100 µm, using a mechanical alloying process,
wherein the first polishing component has a weight not less than 5% and not more than 95% for the weight of the integrated particle,
wherein the second polishing component has a weight not less than 5% and not more than 95% for the weight of the integrated particle,
wherein each of the first polishing component and the second polishing component is partially exposed to an outer surface of the integrated particle,
the first polishing component having a particle shape and having a Mohs' hardness not less than 7 and not more than 9;

the second polishing component having a particle shape and having a chemical polishing property for inducing a mechanochemical effect on an object material of sapphire; and a friction heat reaction component having a particle shape, produced from alkali metal salt or an alkaline earth metal salt, and insoluble to pure water used in a slurry, wherein the first polishing component, the second polishing component, and the friction heat reaction component are integrated to a particle using a mechanical alloying process, wherein the friction heat reaction component comprises one or more of $CaCO_3$, $SrCO_3$, $MgCO_3$, $BaCO_3$, $Li_2CO_3$, $Ca_3(PO_4)_2$, $Li_3PO_4$, and $AlK(SO_4)_2$, and wherein the friction heat reaction component has a weight not less than 5% and not more than 95% for the weight of the integrated particle.

10. An abrasive particle for polishing sapphire as the object material in a wet polishing method comprising:

a first polishing component which is an inorganic compound having a Mohs' hardness equal to or lower than the object material; and a second polishing component for chemically altering the object material wherein the first polishing component and the second polishing component are integrated to a particle having a size not less than 0.05 μm and not more than 100 μm through an amorphous layer, while maintaining inherent material properties respectively, wherein the first polishing component has a weight not less than 5% and not more than 95% for the weight of the integrated particle, wherein the second polishing component has a weight not less than 5% and not more than 95% for the weight of the integrated particle, wherein each of the first polishing component and the second polishing component is partially exposed to an outer surface of the integrated particle, the first polishing component having a particle shape and having a Mohs' hardness not less than 7 and not more than 9;

the second polishing component having a particle shape and having a chemical polishing property for inducing a mechanochemical effect on an object material of sapphire; and a friction heat reaction component having a particle shape, produced from alkali metal salt or an alkaline earth metal salt, and insoluble to pure water used in a slurry, wherein the first polishing component, the second polishing component, and the friction heat reaction component are integrated to a particle using a mechanical alloying process, wherein the friction heat reaction component comprises one or more of $CaCO_3$, $SrCO_3$, $MgCO_3$, $BaCO_3$, $Li_2CO_3$, $Ca_3(PO_4)_2$, $Li_3PO_4$, and $AlK(SO_4)_2$, and wherein the friction heat reaction component has a weight not less than 5% and not more than 95% for the weight of the integrated particle.

11. The abrasive particle according to claim 9, wherein the first polishing component comprises one of $Al_2O_3$, $ZrSiO_4$, and $ZrO_2$, and wherein the first polishing component has a weight not less than 5% and not more than 95% for the weight of the integrated particle.

12. The abrasive particle according to claim 10, wherein the first polishing component comprises one of $Al_2O_3$, $ZrSiO_4$, and $ZrO_2$, and wherein the first polishing component has a weight not less than 5% and not more than 95% for the weight of the integrated particle.

13. The abrasive particle according to claim 9, wherein the second polishing component comprises one or more of $Cr_2O_3$, $Fe_2O_3$, and $SiO_2$, and wherein the second polishing component has a weight not less than 5% and not more than 95% for the weight of the integrated particle.

14. The abrasive particle according to claim 10, wherein the second polishing component comprises one or more of $Cr_2O_3$, $Fe_2O_3$, and $SiO_2$, and wherein the second polishing component has a weight not less than 5% and not more than 95% for the weight of the integrated particle.

15. The abrasive particle according to claim 9, wherein the first polishing component comprises one of $Al_2O_3$, $ZrSiO_4$, and $ZrO_2$, wherein the second polishing component comprises one or more of $Cr_2O_3$, $Fe_2O_3$, and $SiO_2$, and wherein the friction heat reaction component comprises one or more of $CaCO_3$, $SrCO_3$, $MgCO_3$, $BaCO_3$, $Li_2CO_3$, $Ca_3(PO_4)_2$, $Li_3PO_4$, and $AlK(SO_4)_2$.

16. The abrasive particle according to claim 10, the first polishing component comprises one of $Al_2O_3$, $ZrSiO_4$, and $ZrO_2$, wherein the second polishing component comprises one or more of $Cr_2O_3$, $Fe_2O_3$, and $SiO_2$, and wherein the friction heat reaction component comprises one or more of $CaCO_3$, $SrCO_3$, $MgCO_3$, $BaCO_3$, $Li_2CO_3$, $Ca_3(PO_4)_2$, $Li_3PO_4$, and $AlK(SO_4)_2$.

17. An abrasive particle for polishing an object material formed from a silicon carbide or a gallium nitride comprising:

a chemical polishing component for exerting a mechanical polishing action to oxidize a polishing surface of the object material in response to a friction heat generated during the polishing process; and a reaction promotor for promoting the oxidization of the polishing surface with the frictional heat, wherein the chemical polishing component and the reaction promotor are integrated to a particle using a mechanical alloying process, while maintaining inherent material properties respectively, wherein the chemical polishing component comprises an oxide material or a multiple oxide material of transition metal element, which belongs to third to eleventh group of periodic table except Zr, or an oxide or a multiple oxide material of twelfth group element (zinc group element) of periodic table, or the chemical polishing component comprises $MnO_2$, and the chemical polishing component has a weight not less than 5% and not more than 95% for the weight of the integrated particle, and wherein the reaction promotor comprises alkali metal salt or alkaline earth metal salt, which is insoluble to pure water, or the reaction promotor comprises $CaCO_3$, and the reaction promotor has a weight not less than 5% and not more than 95% for the weight of the integrated particle.

18. An abrasive particle for polishing an object material formed from a silicon carbide or a gallium nitride comprising:

a mechanical polishing component for exerting a mechanical polishing action to mechanically remove the oxidized polishing surface; and a chemical polishing component for exerting a chemical polishing action to a polishing surface of the object material during the polishing process, wherein the mechanical polishing component and the chemical polishing component are integrated to a particle using a mechanical alloying process, while maintaining inherent material properties respectively, wherein the mechanical polishing component comprises SiC, $Al_2O_3$, $ZrSiO_4$, $ZrO_2$, or the other silicate compound, and wherein the mechanical polishing component has a modified Mohs' hardness not less than 9 and not more than 13, or wherein the mechanical polishing component comprises talc, mica, or the other silicate compound, and wherein the mechanical polishing component has a modified Mohs' hardness less than 9, and the mechanical polishing component has a weight not less than 5% and not more than 95% for the weight of the integrated particle, and wherein the chemical polishing component comprises an oxide material or a multiple oxide material of transition metal element, which belongs to third to eleventh group of periodic table except Zr, or an oxide or a multiple oxide material of twelfth group element (zinc group element) of periodic table, or the chemical polishing component comprises $MnO_2$, and the chemical polishing component has a weight not less than 5% and not more than 95% for the weight of the integrated particle.

19. An abrasive particle for polishing an object material formed from a silicon carbide or a gallium nitride comprising:

a mechanical polishing component for exerting a mechanical polishing action to mechanically remove the oxidized polishing surface;

a chemical polishing component for exerting a mechanical polishing action to oxidize a polishing surface of the object material in response to a friction heat generated during the polishing process; and a reaction promotor for promoting the oxidization of the polishing surface with the frictional heat, wherein the mechanical polishing component, the chemical polishing component and the reaction promotor are integrated to a particle using a mechanical alloying process, while maintaining inherent material properties respectively, wherein the mechanical polishing component comprises SiC, $Al_2O_3$, $ZrSiO_4$, $ZrO_2$, or the other silicate compound, and wherein the mechanical polishing component has a modified Mohs' hardness not less than 9 and not more than 13, or wherein the mechanical polishing component comprises talc, mica, or the other silicate compound, and wherein the mechanical polishing component has a modified Mohs' hardness less than 9, and the mechanical polishing component has a weight not less than 5% and not more than 95% for the weight of the integrated particle, wherein the chemical polishing component comprises an oxide material or a multiple oxide material of transition metal element, which belongs to third to eleventh group of periodic table except Zr, or an oxide or a multiple oxide material of twelfth group element (zinc group element) of periodic table, or the chemical polishing component comprises $MnO_2$, and the chemical polishing component has a weight not less than 5% and not more than 95% for the weight of the integrated particle, and wherein the reaction promotor comprises alkali metal salt or alkaline earth metal salt, which is insoluble to pure water, or the reaction promotor comprises $CaCO_3$, and the reaction promotor has a weight not less than 5% and not more than 95% for the weight of the integrated particle.

20. The abrasive particle according to claim 17, wherein the particle having a size not less than 0.05 µm and not more than 100 µm, using a mechanical alloying process in a slurry.

21. The abrasive particle according to claim 17, wherein each of the polishing components is partially exposed to an outer surface of the integrated particle.

22. The abrasive particle according to claim 18, wherein the particle having a size not less than 0.05 µm and not more than 100 µm, using a mechanical alloying process in a slurry.

23. The abrasive particle according to claim 18, wherein each of the polishing components is partially exposed to an outer surface of the integrated particle.

24. The abrasive particle according to claim 19, wherein the particle having a size not less than 0.05 µm and not more than 100 µm, using a mechanical alloying process in a slurry.

25. The abrasive particle according to claim 19, wherein each of the polishing components is partially exposed to an outer surface of the integrated particle.

* * * * *